(12) United States Patent
Arunachalam et al.

(10) Patent No.: US 9,361,417 B2
(45) Date of Patent: Jun. 7, 2016

(54) PLACEMENT OF SINGLE-BIT AND MULTI-BIT FLIP-FLOPS

(71) Applicant: SYNOPSYS, INC., Mountain View, CA (US)

(72) Inventors: Anand Arunachalam, Sunnyvale, CA (US); Suman Chatterjee, Bengaluru (IN); Jing C. Lin, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 50 days.

(21) Appl. No.: 14/192,413

(22) Filed: Feb. 27, 2014

(65) Prior Publication Data

US 2015/0227646 A1 Aug. 13, 2015

Related U.S. Application Data

(60) Provisional application No. 61/937,104, filed on Feb. 7, 2014.

(51) Int. Cl.
*G06F 17/50* (2006.01)
(52) U.S. Cl.
CPC .................................. *G06F 17/5072* (2013.01)
(58) Field of Classification Search
CPC .............. G06F 17/505; G06F 17/5081; G06F 2217/84; G06F 2217/06; G06F 2217/08
USPC .................. 716/103, 132–135, 139
See application file for complete search history.

(56) References Cited

U.S. PATENT DOCUMENTS

| 5,519,627 | A | 5/1996 | Mahmood et al. |
| 5,535,134 | A | 7/1996 | Cohn et al. |
| 5,754,826 | A | 5/1998 | Gamal et al. |
| 6,006,024 | A | 12/1999 | Guruswamy et al. |
| 6,018,622 | A * | 1/2000 | Lin et al. .................. 716/105 |
| 6,189,131 | B1 | 2/2001 | Graef et al. |
| 6,209,123 | B1 | 3/2001 | Maziasz et al. |
| 6,237,129 | B1 | 5/2001 | Patterson et al. |
| 6,298,469 | B1 | 10/2001 | Yin |
| 6,480,995 | B1 | 11/2002 | Schmidt et al. |
| 6,493,658 | B1 | 12/2002 | Koford et al. |
| 6,560,753 | B2 | 5/2003 | Barney et al. |
| 7,003,751 | B1 | 2/2006 | Stroomer et al. |
| 7,103,858 | B2 | 9/2006 | Byrn et al. |
| 7,328,420 | B1 | 2/2008 | Datta et al. |
| 7,386,823 | B2 | 6/2008 | Tsai et al. |
| 7,424,695 | B2 | 9/2008 | Tamura et al. |
| 7,434,187 | B2 | 10/2008 | Brahme et al. |
| 7,549,137 | B2 | 6/2009 | Alpert et al. |
| 7,581,197 | B2 | 8/2009 | Arunachalam |
| 7,603,641 | B2 | 10/2009 | Lin |
| 7,657,852 | B2 | 2/2010 | Waller |

(Continued)

OTHER PUBLICATIONS

V Zyuban et al. "Design Methodology for Low Power High Performance Semi Custom Processor Cores" IBM Research Report, Electrical Engineering Dec. 10, 2003,pp. 1-25.

(Continued)

*Primary Examiner* — Nghia Doan
(74) *Attorney, Agent, or Firm* — Kenta Suzue; Haynes Beffel & Wolfeld LLP

(57) ABSTRACT

Technology is disclosed for placement of single-bit flip-flops and multi-bit flip-flops. Single-bit flip-flops with replaced with multi-bit flip-flops and/or relative placement groups of single-bit flip-flops.

16 Claims, 26 Drawing Sheets

(56) References Cited

U.S. PATENT DOCUMENTS

| | | |
|---|---|---|
| 7,685,545 B2 | 3/2010 | Chapman et al. |
| 7,703,059 B2 | 4/2010 | Murray et al. |
| 7,712,064 B2 | 5/2010 | Scheffer et al. |
| 7,774,732 B2 | 8/2010 | KleinOsowski et al. |
| 7,827,510 B1 | 11/2010 | Schubert et al. |
| 7,904,874 B2 * | 3/2011 | Nieh ................ G06F 1/10 716/113 |
| 7,937,682 B2 | 5/2011 | Arunachalam et al. |
| 7,992,122 B1 | 8/2011 | Burstein et al. |
| 8,225,262 B1 | 7/2012 | Tom et al. |
| 8,239,792 B2 | 8/2012 | Arunachalam |
| 8,356,266 B1 | 1/2013 | Ou et al. |
| 8,434,035 B2 | 4/2013 | Arunachalam |
| 8,490,039 B2 | 7/2013 | Agrawal et al. |
| 8,751,986 B2 | 6/2014 | Arunachalam et al. |
| 8,984,467 B2 | 3/2015 | Arunachalam |
| 2003/0182642 A1 | 9/2003 | Schubert et al. |
| 2004/0015803 A1 | 1/2004 | Huang et al. |
| 2004/0078767 A1 | 4/2004 | Burks et al. |
| 2004/0119496 A1 | 6/2004 | Park et al. |
| 2004/0221249 A1 | 11/2004 | Lahner et al. |
| 2005/0076316 A1 | 4/2005 | Pierrat et al. |
| 2005/0125754 A1 | 6/2005 | Schubert et al. |
| 2005/0268258 A1 | 12/2005 | Decker |
| 2006/0095879 A1 | 5/2006 | Brahme et al. |
| 2006/0095883 A1 | 5/2006 | Lakshmanan et al. |
| 2006/0117274 A1 | 6/2006 | Tseng et al. |
| 2006/0190847 A1 | 8/2006 | Yang et al. |
| 2006/0271894 A1 | 11/2006 | Arunachalam |
| 2007/0016884 A1 | 1/2007 | Nishimaru |
| 2007/0022399 A1 | 1/2007 | Tsai et al. |
| 2007/0079273 A1 | 4/2007 | Lahner et al. |
| 2008/0111158 A1 | 5/2008 | Sherlekar et al. |
| 2008/0127018 A1 | 5/2008 | Alpert et al. |
| 2008/0148203 A1 | 6/2008 | Alpert et al. |
| 2008/0209038 A1 | 8/2008 | Tufano |
| 2008/0301608 A1 | 12/2008 | McElvain |
| 2008/0313589 A1 | 12/2008 | Maixner et al. |
| 2009/0031278 A1 | 1/2009 | McElvain et al. |
| 2009/0049418 A1 | 2/2009 | KleinOsowski et al. |
| 2009/0083685 A1 | 3/2009 | Gidon et al. |
| 2009/0146322 A1 | 6/2009 | Weling et al. |
| 2009/0199142 A1 * | 8/2009 | Arunachalam et al. ........... 716/5 |
| 2011/0066987 A1 | 3/2011 | Handa |
| 2011/0173583 A1 | 7/2011 | Barwin et al. |
| 2012/0284680 A1 | 11/2012 | Iyer et al. |

OTHER PUBLICATIONS

J. Lipman "New Tool Adds Horsepower to Datapath Design", EDN Access, Leading Edge Apr. 9, 1998, consisting of two pages.

T. Ye et al. "Physical Synthesis for Asic Datapath Circuits", IEEE International Symposium on Circuits and Systems, pp. 365-368, May 2002.

T. Ye et al. "Data Path Placement with Regularity", International Conference on Computer-Aided Design, pp. 264-270, 2000.

Chiu-Wing Sham et al., "Optical Cell Flipping in Placement and Floorplanning" DAC 2006, Jul. 24-28, 2006, San Francisco, California, pp. 1109-1114.

IC Compiler Implementation User Guide, Version C-2009.06-SP2, Sep. 2009, Chapter 12, pp. 12-1-12-66.

International Search Report and Written Opinion from PCT/US12/51204 mailed Dec. 21, 2012, consisting of 10 pages.

Hongxia Wang et al., "Electromagnetic Interference and Digital Circuits: An Initial Study of Clock Networks," Electromagnetics, vol. 26, 2006, pp. 73-86.

* cited by examiner

Fig. 18

PLACEMENT OF SINGLE-BIT AND MULTI-BIT FLIP-FLOPS

PRIORITY CLAIM

This application claims the benefit of U.S. Provisional Patent Application No. 61/937,104, filed 7 Feb. 2014 entitled Placement of Single-Bit and Multi-Bit Flip-Flops. This application is incorporated herein by reference.

BACKGROUND

1. Field of the Invention

The technology relates to integrated circuit fabrication, and more particularly to placement, routing, and optimization of an integrated circuit design that obeys rules that specify the relative placement of circuit elements.

2. Description of Related Art

An integrated circuit design flow typically proceeds through the following stages: product idea, EDA software, tapeout, fabrication equipment, packing/assembly, and chips. The EDA software stage includes the steps shown in the following table:

| EDA step | What Happens |
| --- | --- |
| System Design | Describe the functionality to implement<br>What-if planning<br>Hardware/software architecture partitioning |
| Logic Design and Functional Verification | Write VHDL/Verilog for modules in system<br>Check design for functional accuracy, does the design produce correct outputs? |
| Synthesis and Design for Test | Translate VHDL/Verilog to netlist<br>Optimize netlist for target technology<br>Design and implement tests to permit checking of the finished chip |
| Design Planning | Construct overall floor plan for the chip<br>Analyze same, timing checks for top-level routing |
| Netlist Verification | Check netlist for compliance with timing constraints and the VHDL/Verilog |
| Physical Implement. | Placement (positioning circuit elements) and routing (connecting circuit elements) |
| Analysis and Extraction | Verify circuit function at transistor level, allows for what-if refinement |
| Physical Verfication (DRC, LRC, LVS) | Various checking functions: manufact., electrical, lithographic, circuit correctness |
| Resolution Enhanc. (OPC, PSM, Assists) | Geometric manipulations to improve manufacturability |
| Mask Data Preparation | "Tape-out" of data for production of masks for lithographic use produce finished chips |

With regard to physical implementation technology, methodologies for structured placement offer circuit designers superior power, yield, and/or area for a given logic function. With the advent of manual placement of transistors, designers created arrayed layouts where logic gates were manually placed in a regularized fashion. This methodology has evolved to the point that automation has been applied to the problem. However, regularized placement still suffers from a great deal of manual effort, such as in cell drive strength selection.

Capturing a priori designer knowledge of structured placement requirements in HDL is a nontrivial problem. Even if captured, structured placement requirements are lost during standard cell random placement. Standard cell placers tend to take more localized views during optimization. This results in not just loss of regularity, but also extra buffering, routing, vias, and cell oversizing, compared to a solution which might be obtained following structured placement.

One approach to this problem is to perform cell sizing and optimization of a structured placement manually through homegrown tools. This approach is quite expensive in terms of engineering effort. This approach is also hard to integrate with the rest of the design. Such integration requires multiple iterations, because standard cell placement and optimization changes the placement, sizing, etc. of the surrounding, non-structured logic. Unfortunately, this triggers another iteration, with further manual sizing and optimization efforts through the homegrown tools for the block with structured placement.

Other approaches to this problem are to generate structured placement through synthesis or through a specific tool, and then pass on the result to a placer through a set of special constraints, or as a macro/IP block. The initial structure generated through synthesis or through the special tool is problematic. Because the initial structure is generated prior to placement, the initial structure is formed lacking complete placement knowledge, and thus the initial structure fails to lead to optimal placement as generation. Also if it is passed as a macro/IP block, then place and route tools cannot resize or otherwise optimize the blocks.

Power optimization is one of the key objectives of IC design. Clock power is responsible for a significant portion of chip power requirements in modern IC design.

SUMMARY

Power consumption in a clock network can be optimized by reducing total clock net length. One way to reduce clock net length is to replace a group of single-bit flip-flops with multi-bit flip-flops. Alternatively, or in combination, another group of single-bit flip-flops can be placed together, or banked together, as a relative placement group. The multi-bit flop offers a smaller load on the clock network compared to a group of single-bit flip-flops, due to shared clock logic that would otherwise be copied multiple times among the single-bit flip-flops. Thus effective replacement of single-bit flops by one or more multi-bit flops can reduce total power, as well as area.

One aspect of the technology is a method of circuit design with a computer system. The computer system generates a placed, routed, and optimized circuit design.

A plurality of single-bit flip-flops in the circuit design are identified, including at least a first set of single-bit flip-flops and a second set of single-bit flip-flops.

The second set of single-bit flip-flops are grouped together as a first relative placement set of single-bit flip-flops. The first set of single-bit flip-flops in the circuit design, are replaced with at least a first set of multi-bit flip-flops in the circuit design.

An initial placement for a netlist of the circuit design is performed according to a first set of rules. A second set of rules for the first relative placement set of single-bit flip-flops are created based on a result of the initial placement. The rules specify positioning of the first relative placement set of single-bit flip-flops. Then placement, routing, and optimization of the netlist of the circuit design are completed according to the rules.

In one embodiment of the technology, responsive to a design failure with the first set of multi-bit flip-flops in the circuit design, the first set of multi-bit flip-flops in the circuit design are replaced, with at least a second relative placement set of single-bit flip-flops in the circuit design.

In one embodiment of the technology, responsive to a design failure with the first set of multi-bit flip-flops in the circuit design, the first set of multi-bit flip-flops in the circuit design are replaced, with at least a second set of multi-bit flip-flops in the circuit design. Multi-bit flip-flops in the second set of multi-bit flip-flops have fewer inputs per flip-flop than in the first set of multi-bit flip-flops in the circuit design.

In one embodiment of the technology, responsive to a design failure with the first set of multi-bit flip-flops in the circuit design, the first set of multi-bit flip-flops in the circuit design are replaced, with at least (i) a second set of multi-bit flip-flops in the circuit design and (ii) a third set of single-bit flip flops, wherein multi-bit flip-flops in the second set of multi-bit flip-flops have fewer inputs per flip-flop than in the first set of multi-bit flip-flops in the circuit design.

In one embodiment of the technology, responsive to a design failure with the first set of multi-bit flip-flops in the circuit design, the first set of multi-bit flip-flops in the circuit design are replaced, with at least (i) a second set of multi-bit flip-flops in the circuit design and (ii) a second relative placement set of single-bit flip flops, wherein multi-bit flip-flops in the second set of multi-bit flip-flops having fewer inputs per flip-flop than in the first set of multi-bit flip-flops in the circuit design.

In one embodiment of the technology, responsive to a design success with the first relative placement set of single-bit flip-flops in the circuit design, the first relative placement set of single-bit flip-flops in the circuit design are replaced, with at least a second set of multi-bit flip-flops in the circuit design.

In one embodiment of the technology, responsive to a design success with the first relative placement set of single-bit flip-flops in the circuit design, the first relative placement set of single-bit flip-flops in the circuit design are replaced, with at least (i) a second set of multi-bit flip-flops in the circuit design and (ii) a third set of single-bit flip-flops in the circuit design.

In one embodiment of the technology, responsive to a design success with the first relative placement set of single-bit flip-flops in the circuit design, the first relative placement set of single-bit flip-flops in the circuit design are replaced, with at least (i) a second set of multi-bit flip-flops in the circuit design and (ii) a second relative placement set of single-bit flip-flops in the circuit design.

Another aspect of the technology is a method of circuit design with a computer system. The computer system generates a placed, routed, and optimized circuit design.

A plurality of single-bit flip-flops in the circuit design are identified, including at least a first relative placement set of single-bit flip-flops.

An initial placement for a netlist of the circuit design is performed according to a first set of rules.

A second set of rules for the first relative placement set of single-bit flip-flops are created based on a result of the initial placement. The rules specify positioning of the first relative placement set of single-bit flip-flops.

The first relative placement set of single-bit flip-flops in the circuit design are replaced with at least a first set of multi-bit flip-flops in the circuit design.

In one embodiment of the technology, said replacing includes, replacing the first relative placement set of single-bit flip-flops in the circuit design with at least (i) the first set of multi-bit flip-flops in the circuit design and (ii) a set of single-bit flip-flops.

In one embodiment of the technology, said replacing includes, replacing the first relative placement set of single-bit flip-flops in the circuit design with at least (i) the first set of multi-bit flip-flops in the circuit design and (ii) a second relative placement set of single-bit flip-flops.

In one embodiment of the technology, said replacing the first relative placement set of single-bit flip-flops in the circuit design, with at least the first set of multi-bit flip-flops in the circuit design, is responsive to: a design success with the first relative placement set of single-bit flip-flops in the circuit design.

In one embodiment of the technology, responsive to a design failure with the first set of multi-bit flip-flops in the circuit design, the first set of multi-bit flip-flops in the circuit design are replaced, with at least a second relative placement set of single-bit flip-flops in the circuit design.

In one embodiment of the technology, responsive to a design failure with the first set of multi-bit flip-flops in the circuit design, the first set of multi-bit flip-flops in the circuit design are replaced, with at least a second set of multi-bit flip-flops in the circuit design, multi-bit flip-flops in the second set of multi-bit flip-flops having fewer inputs per flip-flop than in the first set of multi-bit flip-flops in the circuit design.

Another aspect of the technology is a method of circuit design with a computer system. The computer system generates a placed, routed, and optimized circuit design.

A plurality of flip-flops in the circuit design are identified, including at least a first set of multi-bit flip-flops.

The first set of multi-bit flip-flops in the circuit design are replaced with a first relative placement set of single-bit flip-flops in the circuit design.

An initial placement for a netlist of the circuit design is performing according to a first set of rules.

A second set of rules for the first relative placement set of single-bit flip-flops are created based on a result of the initial placement. The rules specify positioning of the first relative placement set of single-bit flip-flops.

In one embodiment of the technology, said replacing the first set of multi-bit flip-flops in the circuit design, with at least the first relative placement set of single-bit flip-flops in the circuit design, is responsive to a design failure with the first set of multi-bit flip-flops in the circuit design.

In one embodiment of the technology, responsive to a design success with the first relative placement set of single-bit flip-flops in the circuit design, the first relative placement set of single-bit flip-flops in the circuit design are replaced, with at least a second set of multi-bit flip-flops in the circuit design.

In one embodiment of the technology, responsive to a design success with the first relative placement set of single-bit flip-flops in the circuit design, the first relative placement set of single-bit flip-flops in the circuit design are replaced, with at least (i) a second set of multi-bit flip-flops in the circuit design and (ii) a set of single-bit flip-flops in the circuit design.

In one embodiment of the technology, responsive to a design success with the first relative placement set of single-bit flip-flops in the circuit design, the first relative placement set of single-bit flip-flops in the circuit design are replaced, with at least (i) a second set of multi-bit flip-flops in the circuit design and (ii) a second relative placement set of single-bit flip-flops in the circuit design.

Other embodiments include a computer readable medium with computer readable instructions for circuit design, with computer instructions that perform the technology described herein; a circuit design generated with the technology described herein; and an electrical circuit with circuitry designed by the technology described herein.

BRIEF DESCRIPTION OF THE DRAWINGS

FIG. 18 shows the placement of relative placement cells in a circuit design containing keepouts.

DETAILED DESCRIPTION

Relative placement information generates a structure of the instances and controls the placement of the instances. The resulting annotated netlist is used for physical optimization, during which the placement, routing, and optimization tool preserves the structure.

Figure 1:
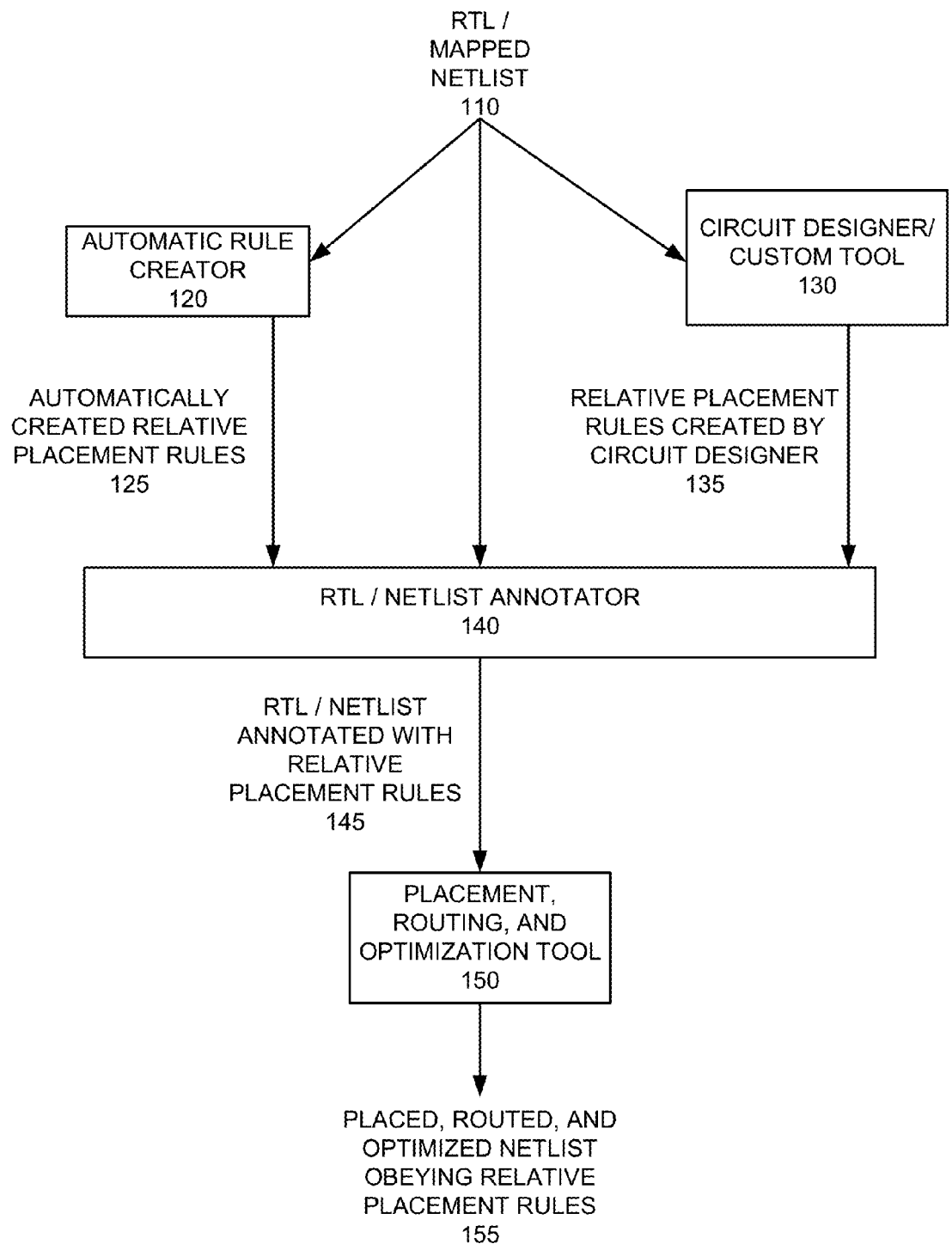
FIG. 1 is a flow diagram illustrating an exemplary process for using relative placement in circuit design.

FIG. 1 shows the overall flow for using relative placement. Relative placement usually is applied to datapaths and registers, but relative placement can be applied to any cells in a circuit design, controlling the exact relative placement topology of gate-level logic groups and defining the circuit layout.

At 110, a mapped netlist (a structural interconnection of library cells) is read. At 140, a netlist annotator adds annotations of the relative placement constraints to the mapped netlist. The relative placement constraints may have come from an automatic rule creator 120, which generates automatically created relative placement rules 125. Also, the relative placement constraints may have come from the circuit designer/custom tool 130, which generates relative placement rules created by the circuit designer 135. Based on the mapped netlist 110 and the relative placement rules, the netlist annotator 140 generates a netlist annotated with relative placement rules 145.

The netlist annotator 140, which may be GUI-based or text-based provides a way create relative placement structures for the placement, routing, and optimization tool 150. In a GUI-based annotator, the relative placement can be specified by drag-and-drop of circuit elements into positions relative to other circuit elements. Clicking multiple circuit elements and assigning an identifier such as a color, a pattern, or a name can define multiple groups with respective relative placement rules. With a text-based annotator, relative column and row positions can be specified of instances with respect to each other. These placement constraints create relative placement structures that are preserved during placement and legalization. Whether GUI-based or text-based, the cells in each structure group are placed as a single entity.

The placement, routing, and optimization tool 150 receives the netlist annotated with relative placement rules 145 and generates the placed, routed, and optimized netlist obeying relative placement rules 155. The optimization includes, for example, orientation optimization.

Figure 2:
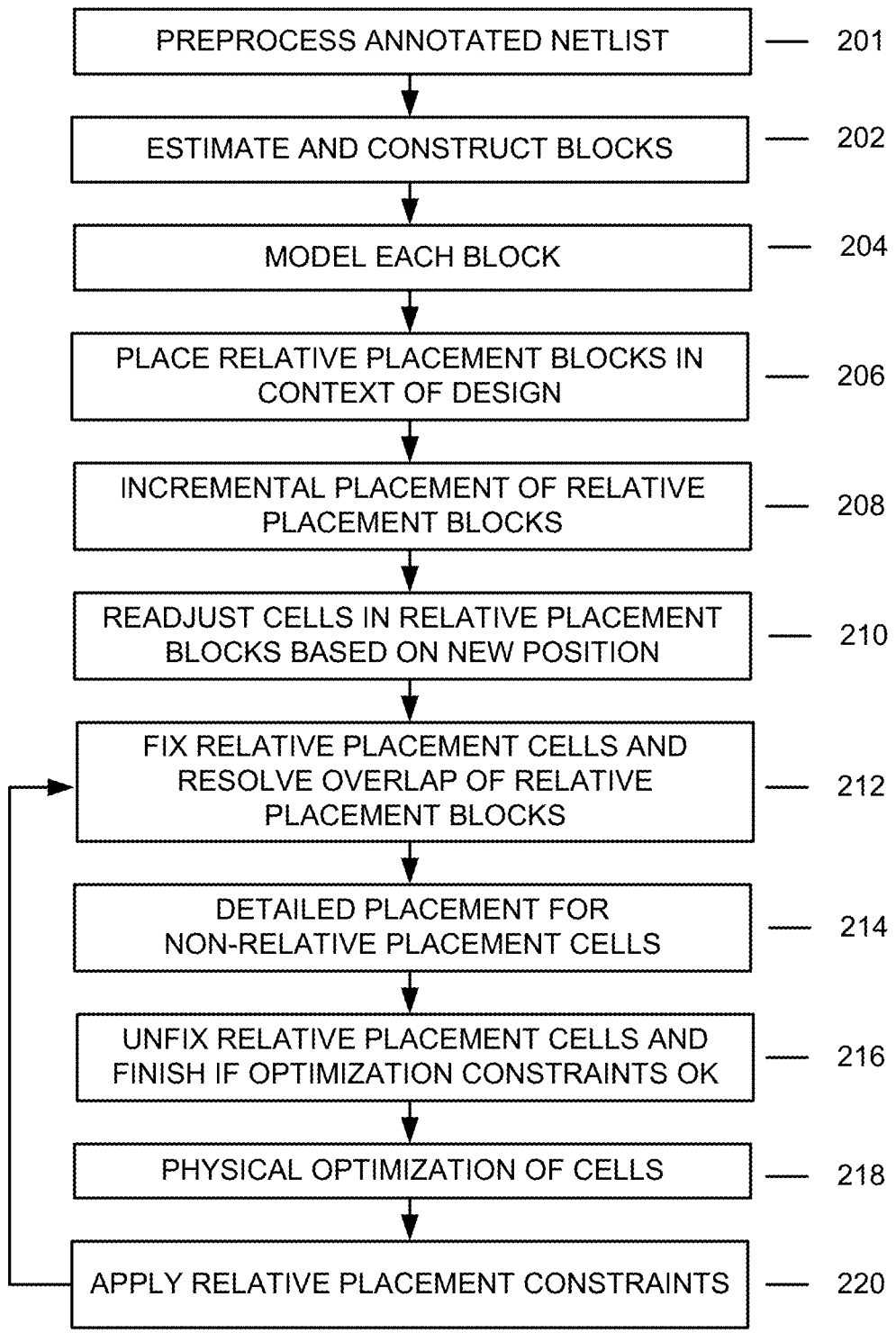
FIG. 2 is a flow diagram illustrating an exemplary process of the placement, routing, and optimization tool.

FIG. 2 shows an exemplary process flow of a placement, routing, and optimization tool. At 201, an annotated netlist is preprocessed for the relative placement annotation. Data structures are created to carry relative placement information. At 202, the sizes of relative placement blocks and aspect ratios are estimated by applying relative placement rules for each relative placement block. Any hierarchical relative placement blocks are estimated also. At 204, each of the estimated relative placement blocks is modeled for coarse placement purposes, for example as a macro with pin locations visible but the internal cells hidden from the coarse placer. At 206, the relative placement blocks are placed within the context of entire design, including the cells which have the relative placement rules simultaneously along with the cells which do not have relative placement rules. Among the relative placement blocks of cells, the blocks are placed one at a time. At 208, if needed another incremental placement is done for area recovery of sparse relative placement blocks. One block at a time is fixed based on the locations returned by the coarse placer. Individual relative placement instances are fixed before such area recovery. At 210, individual instances of cells are readjusted within each relative placement block, based on new locations determined by the placer according to the optimization constraints. User constraints are respected for each relative placement block. At 212, the nearest legal locations for all the relative placement cells are found, and the relative placement cells fixed there. Any overlaps of relative placement blocks are resolved by checking each of the already fixed blocks and making sure that the moved blocks do not overlap with them. If overlaps occur, the moved blocks are moved with minimal movement as the cost. At 214, detailed placement is done for the non-relative placement cells, considering the fact that cells with relative placement are already fixed. At 216, all relative placement cells are unfixed. If optimization and relative placement constraints are met, then the tool can stop, finish writing out the placed and routed netlist, and exit the placement and optimization process. At 218, physical optimization is done for all the instances, including relative placement instances, to meet timing or any other user specified goals. This could focus on the most critical objectives such as timing, respecting design rules, congestion, wire length etc. The optimization includes, for example, orientation optimization. At 220, relative placement constraints are reapplied, and locations readjusted based on optimization results. Thus, the relative placement constraints specified in the annotated netlist are preserved. The process then loops back to 212.

The above process can be rearranged, for example by combining, adding, removing, or modifying steps. For example, 212-216 can be rearranged, depending on the design, and 208 and 210 can be combined into one step.

Benefits of Relative Placement

Various embodiments that implement relative placement provide one or more of the following benefits:

1) Provides a method to maintain structured placement for legacy or intellectual property (IP) designs using a placement, routing, and optimization tool.

2) Handles flat and hierarchical designs.

3) For complex designs, a typical design can have many engineers working on it and many blocks. Hierarchical relative placement enables placing those blocks together relative to each other more easily. Any number of levels of hierarchies are allowed.

4) Reduces the placement search space in critical areas of the design resulting in greater predictability of QoR (wire length, timing, power) and congestion.

5) Is technology independent.

6) Improves routability.

Relative Placement Considerations

Various embodiments that implement relative placement require one or more of the following considerations:

1) When the placement, routing, and optimization tool estimates that the size of a relative placement block is not suitable to the given floorplan, the placement, routing, and optimization tool can fail in placement. To maintain relative placement information precisely, there should be enough space for relative placement blocks without overlapping placement obstructions in the design floorplan.

2) If the design contains multiheight cells and exact relative placement (perfect alignment of the cells on one or more sides of the row or column) is used, the current relative placement implementation might not get perfect alignment in every case.

3) There is no limit on the number of cells in a relative placement group. However, if the design has many relative placement groups, at times coarse placement returns overlapping group locations, resulting in misalignment. In these cases, a warning appears after coarse placement.

The following is a specific exemplary implementation of the discussed process flow. Many of the examples which follow are implemented with a text-based shell. The text-based examples are provided for in an exemplary Synopsys™ design environment for the purposes of illustration. The examples are also applicable to a GUI-based environment, in which the text-based commands are replaced or complemented with a mouse-driven interface.

Exemplary Relative Placement Flow

Implementing the methodology for the relative placement flow follows several steps.

1. In a design environment that permits a user to decide whether or not to use relative placement, relative placement is enabled. Relative placement is enabled by entering "XG mode", performed by entering the shell command: psyn_shell-xg-t> set physopt_enable_rp_in_xg_mode "true"

2. The gate-level netlist is prepared and read it in to the placement, routing, and optimization tool, using the read_milkyway or read_db command.

3. The relative placement data are prepared.

Create the relative placement groups. Use the create_rp_group command.

Add relative placement items to the groups. Use the add_to_rp_group command.

The netlist annotator annotates the netlist with the relative placement information, and generates a placed netlist containing the data.

4. Preserve the relative placement information in the annotated netlist. Use set_size_only to preserve relative placement information for cells that contain it. For example, enter psyn_shell-xg-t> set_size_only {RP_cells} true 5. Set the block utilization of the relative placement block. The block utilization is how densely a block is packed. A value of 1 indicates no gap between columns. It could vary between 0 and less than or equal to 1. Enter psyn_shell-xg-t> set physopt_use block_utilization true The default value is 1.0.

6. Read floorplan information. For example, enter psyn_shell-xg-t> read_pdef top.pdef 7. Perform coarse placement for the design. Use the create_placement command.

8. Analyze the design using the placement, routing, and optimization tool GUI.

9. If the relative placement result is not acceptable, modify the relative placement file and run this procedure again.

If the relative placement is acceptable, then perform optimization, by running physopt.

Sample Script for a Relative Placement Flow

The following is a sample script for running a relative placement flow.

```
# Set library and design paths #
source setup.tcl
set physopt_enable_rp_in_xg_mode "true"
# Read db file generated from rp_reader #
read_db block_rp.db
read_db block2_rp.db
read_db other_blocks.db
read_db top.db
current_design top
link
link_physical_library
# Create relative placement #
create_rp_group
...
add_to_rp_group
...
# Apply constraints #
source constraints.tcl
# Apply set_size_only on relative placement cells to preserve relative placement information #
set_size_only {RP_cells} true
# Read floorplan information #
read_pdef top.pdef
# Perform coarse placement on the design #
create_placement
# Perform analysis. If okay, do physical synthesis or #
# incremental physical synthesis #
physopt or physopt -incremental
```

Considerations for Using Relative Placement

A design can contain both structured and unstructured items (leaf cells, keepouts, hierarchical groups). Control of which cells are to be structured is accomplished by including the cells to be structured in a relative placement group.

Determining which portions of the module need to be structured is beneficial. Providing relative placement information for cells that would have been placed better by allowing the placement, routing, and optimization tool to place the cells can produce poor results.

Some designs are appropriate for structured placement (for example, datapaths), whereas others are more appropriate for usual placement by the placement, routing, and optimization tool.

Data Required for Relative Placement

Relative placement requires a gate-level netlist. The format can be any format read by the placement, routing, and optimization tool.

Commands for Relative Placement

The basic functionality for relative placement is carried out by way of dedicated Tcl commands used within the placement, routing, and optimization tool. The commands create groups and add leaf cells, hierarchy, and keepouts to the groups. In addition, a script of annotated information can be generated, edited, and reapplied to the design, and relative placement groups can be removed.

In addition to these dedicated commands, physical synthesis commands are available.

Commands Specific to Relative Placement

Relative placement uses the dedicated commands listed in Table 1.

TABLE 1

Dedicated Commands for Relative Placement

| Command | Described in section |
| --- | --- |
| create_rp_group | See "Creating Relative Placement Groups". |
| add_to_rp_group | See "Adding Items to a Group". |
| write_rp_group | See "Writing Relative Placement Information to a Script File". |
| remove_rp_group | See "Removing Relative Placement Information". |

Other Commands Often Used for Relative Placement

The commands listed in Table 2 are often used for relative placement.

TABLE 2

Other Commands Often Used for Relative Placement

| Command | Described in section |
| --- | --- |
| set_size_only | See "Preserving Relative Placement Information During Optimization". |
| create_bounds | See "Constraining Relative Placement Cell Placement Using Placement Bounds". |
| find | Locates and returns a collection of relative placement groups that match listed names. The man page has information. |
| source | Loads and runs a script file. The man page has information. |

Preserving Relative Placement Information During Optimization

The relative placement information for an instance is attached to the instance. During optimization, relative placement cells can be optimized or removed. When an instance with relative placement information is removed during optimization, relative placement information attached to the instance is also removed.

To prevent relative placement cells from being removed during optimization, apply set_size_only to true on leaf cells to preserve relative placement information for cells that contain it. If relative placement cells are upsized or downsized, the relative placement cell alignment is maintained for placement.

Constraining Relative Placement Cell Placement Using Placement Bounds

The placement of relative placement cells is constrained by defining placement bounds. To do this, use the create_bounds command. Both soft bounds and hard bounds are supported for relative placement cells and both rectangular bounds and rectilinear bounds are supported.

Note: In relative placement, only move bounds (with fixed coordinates) are supported for relative placement cells. Group bounds are not supported. In other embodiments, group bounds are supported in relative placement.

Specify individual cell names as provided in an add_to_rp_group command with the create_bounds command. For example, enter psyn_shell-xg-t> create_bounds-coordinates {100 100 200 200} U1 U2 U3 U4

In other embodiments, a relative placement group is specified.

If some cells of a relative placement group are specified to be inside a bound and some cells are not specified to be inside the bound, cells that are not constrained by the bound are placed as loose cells. This can lead to legally correct but possibly poor placement QoR.

Ignoring Relative Placement Information

The tool can be directed to ignore relative placement information annotated to the design, for example, when to confirm that relative placement is helpful to QoR. To do this, set the variable physopt_ignore_structure to true (default is false).

Setting this variable to true causes the placement, routing, and optimization tool not to do structured placement for any relative placement groups in the design.

When the tool is directed to ignore relative placement information, the parts of the relative placement groups are placed as if the group has no relative placement information.

Removing Relative Placement Information

Relative placement annotation can be removed from an annotated database for one or more relative placement groups. To do this, use the remove_rp_group command.

Note: When a relative placement group is removed, the memory it occupies is freed to be reused by this same process. However, memory is not returned to the operating system until exit from psyn_shell.

To remove relative placement groups, enter psyn_shell-xg-t> remove_rp_group [options]

| To do this | Use this |
| --- | --- |
| List the relative placement groups to remove. (vs. using -all). | group_list |
| Remove all relative placement groups. (vs. using -all). | -all |
| Remove all the designs within the hierarchies of the groups listed in the group list. By omitting this option, subgroups are not removed. (vs. using -all). | -hierarchy |
| During removal, disable printing the groups being removed. | -quiet |

Example

To remove the relative placement group named grp_ripple and confirm its removal, enter

```
psyn_shell-xg-t> find rp_group
{mul::grp_mul ripple::grp_ripple xample3::top_group}
psyn_shell-xg-t> remove_rp_group grp_ripple
Removing rp group 'ripple::grp_ripple'
1
psyn_shell-xg-t> find rp_group grp_ripple
Error: Can't find object 'grp_ripple'. (UID-109)
psyn_shell-xg-t> remove_rp_group -all
Removing rp group 'mul::grp_mul'
Removing rp group 'example3::top_group'
1
```

Modifying Relative Placement Information

A relative placement group can be modified. For example:

Remove items from a group

Rename a group

Move an item from one position to another

Realign or reorient items

A group can be modified in the following ways:

Remove the group to be changed, then create a new group that incorporates the changes.

Generate a script (using write_rp_group) and edit the information in the generated script.

Creating Relative Placement Groups

Figure 3:
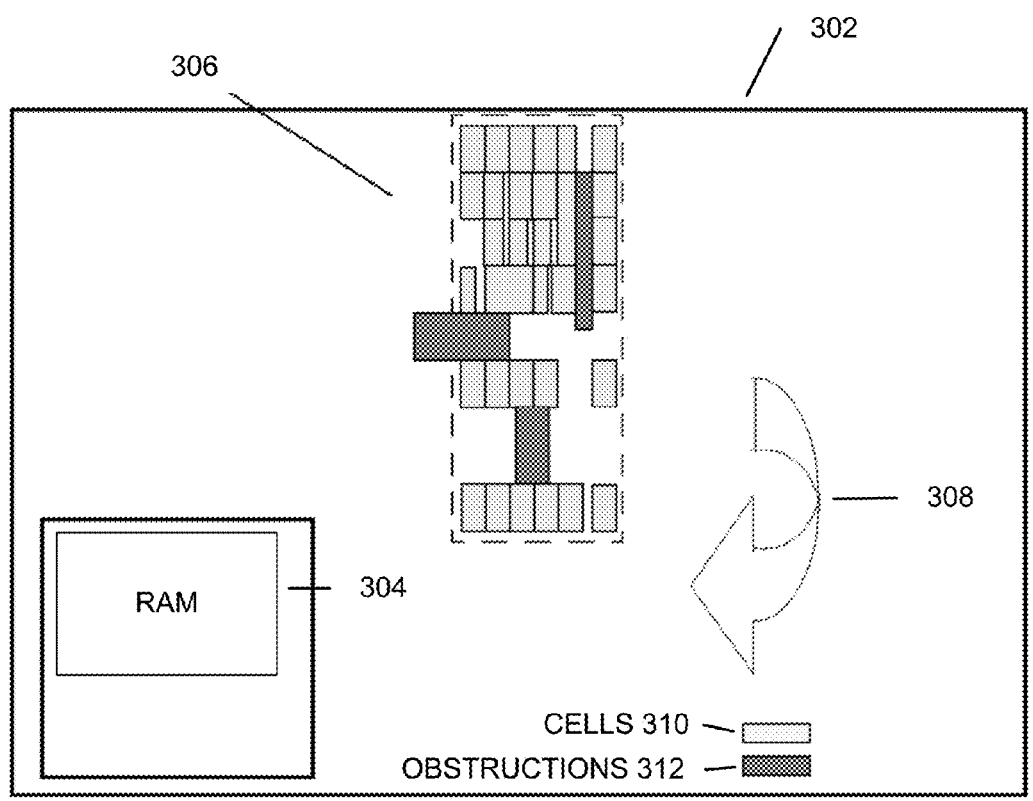
FIG. 3 shows the placement, as a single unit, of a group of circuit elements following relative placement rules.

A relative placement group is an association of cells, other groups, and keepouts. During placement and legalization, the group structure is preserved and the cells in the group are placed as a single entity. To create a group, use the create_rp_group command. The group is placed as a single entity, as shown in FIG. 3. In FIG. 3, floorplan 302 is shown. The group 306 includes cells 310 and obstructions 312. The group can be moved 308 as a single unit. The floorplan 302 also has RAM 304 which is fixed in place.

Positions for Columns and Rows in Relative Placement Data

Figure 4:
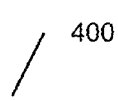
FIG. 4 shows circuit elements organized by relative placement rules into columns and TOWS.

FIG. 4 shows the positions for columns and rows in relative placement data 400. Columns count from column 0 (the leftmost column). Rows count from row 0 (the bottom row). The width of a column is the width of the widest cell in that column. The height of a row is determined by the height of the tallest cell in that row.

In FIG. 4, positions 0 3 (column 0, row 3) and 4 1 (column 4, row 1) are not used and therefore are not specified. Position 1 2 occupies (straddles) columns 1 and 2 in row 2. Position 4 3 in column 4 straddles rows 3 and 4.

Straddling is described in "Creating Relative Placement Structures Containing Multiple Column or Row Positions".

The following points can apply to creating a new group:

A new group is empty. To add leaf cells, hierarchy (other groups), and keepouts to the group, use the add_to_rp_group command.

Any number of groups can be created.

Relative placement groups are persistently stored using the write_milkyway command and read using the read_milkyway command.

The create_rp_group command returns a collection handle (identifier) to the relative placement groups that are created. If no objects were created, the empty string is returned.

To use the create_rp_group command, enter psyn_shell-xg-t> create_rp_group [options]

| To do this | Use this |
|---|---|
| Name the group | group_name |
| Specify the name of the design in which to create the new group. Omitting this option, defaults the design to the current design. Using this switch is good practice. | -design |
| Specify the number of columns for the group, expressed as a positive integer. The default is 1. | -columns |
| Specify the number of rows for the group, expressed as a positive integer. The default is 1. | -rows |
| Specify the default pin name to look up on a cell. By specifying -pin_align_name in an add_to_rp_group command, the value specified in add_to_rp_group overrides the value specified here. See "Aligning Relative Placement by Pins". | -pin_align_name |
| Use the group for hierarchy instantiation. See "Defining Hierarchical Groups for Instantiation". | -instance |
| Anchor the group on the x-axis or the y-axis but allow the group to slide in the other dimension. The values are in microns and the offset is relative to the chip's origin. See "Anchoring Relative Placement Blocks at a Specified Location". | -x_offset or -y_offset |
| Anchor the group on both the x-axis and y-axis by specifying the lower-left coordinates (anchor) for the group. The values are in micron and the offset is relative to the chip's origin. See "Anchoring Relative Placement Blocks at a Specified Location". | -x_offset and -y_offset |

Example

To create the group named rp1 for designA having 1 column and 3 rows, enter psyn_shell-xg-t> create_rp_group rp1-design designA-columns 1 -rows 3

Renaming a Group

A group cannot be renamed directly. To rename a group, remove the group and create a new group that duplicates the removed group but has the new name. Alternatively, generate a script (using write_rp_group) and edit the name in the generated script. In other embodiments, the group can be renamed directly.

Adding Items to a Group

To add leaf cells, hierarchy groups, and keepouts to relative placement groups (created using create_rp_group), use the add_to_rp_group command.

When adding an item to a relative placement group, the following points can apply:

The relative placement group in which the item is added must exist. In another embodiment, a default group is created.

Switches identify whether the item added is a leaf cell (-leaf), hierarchical group (-hierarchy), or a keepout (-keepout).

The syntaxes for adding leaf cells, hierarchy groups, and keepouts differ. Table 3 provides a quick look up of the options allowed for each syntax.

If an item already exists in the group at the given column and row location or if the item to be inserted is already positioned, an error message appears.

The command returns a collection handle (identifier) to the relative placement groups in which the objects are added. If no objects are created, the empty string is returned.

Syntax for Adding a Leaf Cell

The syntax to add a leaf cell is

```
add_to_rp_group group_list -leaf cell_name
    [-column col_number] [-row row_number]
    [-pin_align_name pin_name]
    [-orientation direction]
```

Syntax for Adding a Hierarchical Group

The syntax to add a hierarchical group is

```
add_to_rp_group group_list -hierarchy group_name
    [-instance instance_name]
    [-column col_number] [-row row_number]
```

Syntax for Adding a Keepout

The syntax to add a keepout is

```
add_to_rp_group group_list -keepout keepout_name
    [-column column_number] [-row row_number]
    [-width value] [-height value]
```

Options to Use to Add Items to Relative Placement Groups

Use appropriate options as shown previously in the syntaxes to add items to a relative placement group. The options used depend on the item to be added to the group. Table 3 provides a quick look up for the options available for each add_to_rp_group syntax.

| To do this | Use this |
| --- | --- |
| List the relative placement group names in which to add items. The groups must be for the same design. In other embodiments, different designs are permitted. | group_list |
| Specify the column position in which to add the item (default is 0). Column positions start at 0, which is the leftmost column. | -column |
| Specify the row position in which to add the item (default is 0). Row positions start at 0, which is the bottom row. | -row |
| Add the named leaf cell. Each leaf cell added must exist in the gate-level netlist. (vs. -hierarchy or -keepout for the position specified). In other embodiments, a default cell is created. | -leaf |
| Add the named relative placement group for hierarchy inclusion. The group can be used one time in another group in the same design. See "Defining Hierarchical Groups for Inclusion". (vs. -leaf or -keepout for the position specified). | -hierrarchy |
| Specify the name of the instance on which to instantiate the given hierarchical relative placement group for hierarchy instantiation. A group can be instantiated more than once. See "Defining Hierarchical Groups for Instantiation". Use -instance with -hierarchy. (vs. -leaf or -keepout for the position specified). | -hierarchy -instance |
| Add the named hard keepout. There is no keepout object so the name provided here is to reference the keepout after it is created. See "Adding Keepouts". | -keepout |
| Specify the name of the pin to use for pin alignment of this cell with other cells in a group. If using -pin_align_name, the value specified here overrides a pin name provided with create_rp_group for the relative placement group to which it is being added. See "Aligning Relative Placement by Pins". | -pin_align_name |
| Specify the placement orientation of a cell with respect to the group to which it is added. PDEF or DEF syntax can be used, as follows: PDEF orientations: 0, 90, 180, 270, 0-mirror, 90-mirror, 180-mirror, or 270-mirror DEF orientations: N, W, S, E, FN, FW, FS, or FE See "Specifying Orientation for Leaf Cells". | -orientation |
| Specify the width of the keepout to add. If -width omitted, the keepout defaults to the width of the widest cell in the column in which the keepout is added. Use this option with -keepout and -height. See "Adding Keepouts". | -width |
| Specify the height of the keepout to add. If -height omitted, the keepout defaults to the height of the tallest cell in the column in which the keepout is added. Use this option with -keepout and -width. See "Adding Keepouts". | -height |

Quick Lookup of Options for Add_to_rp_Group Syntaxes

Table 3 provides a quick lookup of the options available for the add_to_rp_group syntaxes.

TABLE 3

Quick Lookup of Options for add_to_rp_group Syntaxes

| Option | Syntax Leaf cell | Hierarchy for Inclusion | Hierarchy for instantiation | Keepout |
| --- | --- | --- | --- | --- |
| group_list | X | X | X | X |
| -column | X | X | X | X |
| -row | X | X | X | X |
| -leaf | X | | | |
| -hierarchy | | X | X | |
| -keepout | | | | X |
| -pin_align_name | X | | | |
| -orientation | X | | | |
| -instance | | | X | |
| -width | | | | X |
| -height | | | | X |

Example

To find relative placement group grp_ripple, add leaf cell U2 to grp_ripple, then instantiate grp_ripple in the top group, enter

```
psyn_shell-xg-t> find rp_group grp_ripple
{ripple::grp_ripple}
psyn_shell-xg-t> add_to_rp_group grp_ripple -leaf carry_in_1
{ripple::grp_ripple}
psyn_shell-xg-t> add_to_rp_group top_group -hierarchy grp_ripple
-instance U2
{example3::top_group}
```

Adding Hierarchical Groups

Hierarchical relative placement allows relative placement groups to be embedded within other relative placement groups. The embedded groups then are handled similarly to leaf cells. To add hierarchical groups, use the add_to_rp_ group command with its -hierarchy or -hierarchy and -instance switches, depending on the type of hierarchical group wanted.

Hierarchical relative placement simplified expression of relative placement constraints. With hierarchical relative placement, providing relative placement information multiple times is unnecessary for a recurring pattern.

Benefits of Using Hierarchical Groups in Relative Placement

Various embodiments that implement hierarchical relative placement provide one or more of the following benefits:

1) Allows organization of relative placement in a manner that is easier to maintain and understand. For example, the relative placement group can bed created to parallel Verilog or VHDL organization.

2) Allows reuse of a repeating placement pattern, for example, an adder.

3) Can reduce the number of lines of relative placement information to be written.

4) Allows integrating blocks.

5) Provides flexibility for the wanted configuration.

Types of Hierarchical Relative Placement Group Usage

Hierarchical relative placement in different ways, depending on whether the relative placement group is used in the same design or in different designs:

Inclusion

Applies to a relative placement group in the same design as the group in which it is included. An included group is used one time in the same design.

See "Defining Hierarchical Groups for Inclusion".

Instantiation

Applies to a relative placement group that is not from the design in which it is instantiated. An instantiated relative placement group can be used multiple times and in multiple places up to the number of times the design of the group is instantiated in the netlist.

See "Defining Hierarchical Groups for Instantiation".

Important:

The syntaxes for creating the hierarchical group definitions for inclusion and for instantiation are the same except the use of -instance switch for instantiation.

Defining Hierarchical Groups for Inclusion

To specify that a group is a hierarchically included group, specify hierarchy by using the -hierarchy switch with the add_to_rp_group command.

When a group is included in a parent group, it is as if the group is directly embedded within the parent group. An included group can be used in another group of the same design one time. However, the new group that contains the included group can be further included in another group in the same design or instantiated in another group of a different design.

See the syntax provided in "Syntax for Adding a Hierarchical Group" and the options summary provided in Table 3.

Example

To include the relative placement group named rp3 as a hierarchical group for inclusion in group rp4, enter psyn_shell-xg-t> add_to_rp_group rp4 -hierarchy rp3 -column 0 -row 0

The script in the following example defines the input for a hierarchical relative placement definition for inclusion. Groups rp1, rp2, rp3, and rp4 are all defined as being part of design top (shown in bold). The contents of groups rp1, rp2, and rp3 are treated as leaf cells when they are included in group rp4.

Example Hierarchical Relative Placement Definition for Inclusion create_rp_group rp1 -design top -columns 2 -rows 1
add_to_rp_group rp1 -leaf U1 -column 0 -row 0
add_to_rp_group rp1 -leaf U4 -column 1 -row 0
create_rp_group rp2 -design top -columns 2 -rows 1
add_to_rp_group rp2 -leaf U2 -column 0 -row 0
add_to_rp_group rp2 -leaf U5 -column 1 -row 0
create_rp_group rp3 -design top -columns 2 -rows 1
add_to_rp_group rp3 -leaf U3 -column 0 -row 0
add_to_rp_group rp3 -leaf U6 -column 1 -row 0
create_rp_group rp4 -design top -columns 1 -rows 3
add_to_rp_group rp4 -hier rp1 -column 0 -row 0
add_to_rp_group rp4 -hier rp2 -column 0 -row 1
add_to_rp_group rp4 -hier rp3 -column 0 -row 2

In the above example,

Groups rp1, rp2, and rp3 are each defined as having two columns and one row.

Group rp4, in which groups rp1, rp2, and rp3 are included (each group used one time), is defined as having one column and three rows.

Each included group is defined as a hierarchical subgroup (group rp1 as subgroup rp1, group rp2 as subgroup rp2, and group rp3 as subgroup rp3).

Group rp4 can be further included as a hierarchical subgroup in another group in the same design.

Figure 5:
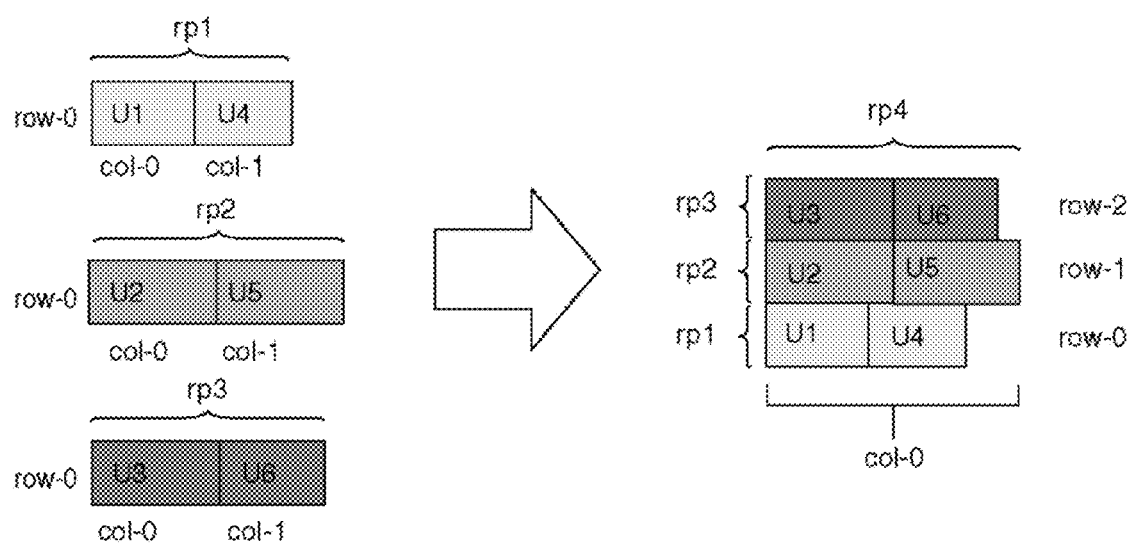
FIG. 5 shows the creation of a hierarchy of circuit elements organized by relative placement rules.

The construction of the resulting hierarchical relative placement structure is shown in FIG. 5.

Groups rp1, rp2, and rp3 are from the same design, top_design. They are included in group rp4, which can be further included one time in top_design.

Defining Hierarchical Groups for Instantiation

Specify that a group is a hierarchically instantiated group by specifying hierarchy plus an instance name with the add_to_rp_group command.

Instantiating a group is a useful way to replicate relative placement information across multiple instances of a design and to create relative placement relationships between those instances. An instantiated group can be used multiple times and in multiple places. For example, various embodiments use hierarchy instantiation for one or more of these cases:

1) Multiple relative placement layouts are to be used for different instances of a design.

2) Despite one layout, relative placement is to be specified between instances of that layout or between instances and other cells and groups.

The syntax for instantiation is the same as the syntax for inclusion but provides the -instance switch in addition to the -hierarchy switch. The -instance switch specifies the hierarchical cell upon which to instantiate the given hierarchical relative placement group. The instance is within the design of the group to which it is added and is an instance of the same design of the group being added hierarchically.

When uniquified, instantiated groups are dropped unless they are required for the newly uniquified group; that is, each instantiation will go to one uniquified design.

See the syntax provided in "Syntax for Adding a Hierarchical Group" and the options summary provided in Table 3.

Example

To instantiate the relative placement group named rp1 using a hierarchical cell instance named I1 in the relative placement group named rp2, enter psyn_shell-xg-t> add_to_rp_group rp2 -hierarchy rp1 -instance I1 -column 0 -row 0

The script in the example below provides a definition for hierarchical relative placement for instantiation. Group rp1 is in the design pair_design (shown in bold) and defines leaf cells U1 and U2 as the group. Group rp2 is in the design mid_design (shown in bold) and instantiates three instances of group rp1 from pair_design, named I1, I2, and I3. Each instance is defined as a subgroup plus an instance name and each is treated as a leaf cell.

Example Definition for Hierarchical Relative Placement for Instantiation create_rp_group rp1 -design pair_design -columns 2 -rows 1
    add_to_rp_group rp1 -leaf U1 -column 0 -row 0
    add_to_rp_group rp1 -leaf U2 -column 1 -row 0
create rp_group rp2 -design mid_design -columns 1 -rows 3
    add_to_rp_group rp2 -hier rp1 -instance I1 -column 0 -row 0
    add_to_rp_group rp2 -hier rp1 -instance I2 -column 0 -row 1
    add_to_rp_group rp2 -hier rp1 -instance I3 -column 0 -row 2

In the above example,

Instances I1, I2, and I3 are hierarchical cells instantiating the design pair_design.

Groups rp1 is defined as having two columns and one row and contains leaf cells U1 and U2.

Group rp2, in which group rp1 is instantiated three times, is defined as having one column and three rows. Each instantiated group is defined as a hierarchical subgroup containing a named instance.

Group rp2 is treated as a leaf cell, and can be used multiple times if it is further instantiated.

Figure 6:
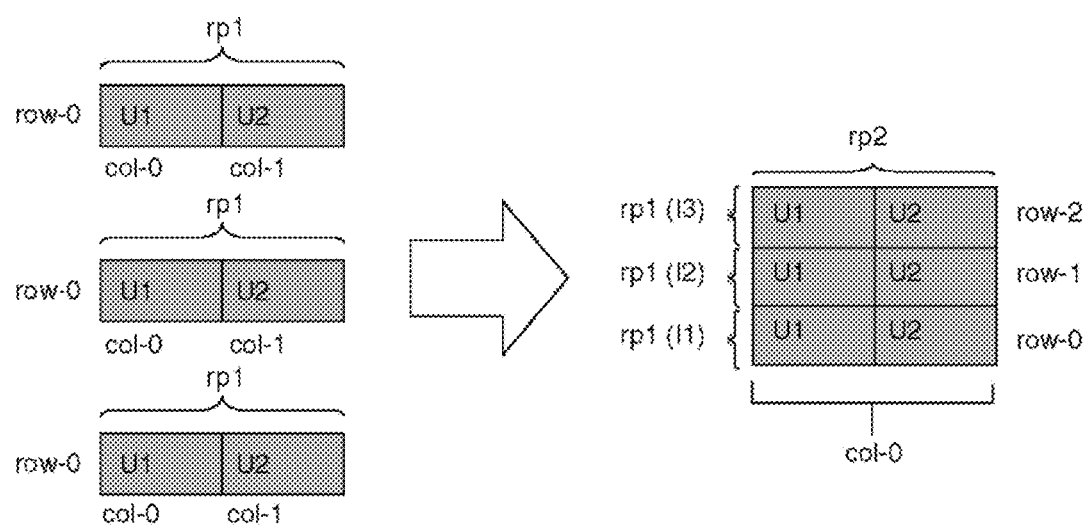
FIG. 6 shows the creation of a multiple instances of circuit elements hierarchically organized by relative placement rules.

The construction of the resulting hierarchical relative placement block is shown in FIG. 6.

Group rp1 belongs to the design pair_design. It is instantiated three times in group rp2, which can be further instantiated in different designs.

Ungrouping Hierarchical Relative Placement

The ungroup command changes hierarchical relative placement structure.

After using ungroup, hierarchical relative placement instantiation is converted to hierarchical relative placement inclusion because the design is flattened and all the groups are now of the same design. Instantiation of hierarchical modules no longer exists.

Relative placement groups affected by an ungroup command are renamed to show the path to the group before flattening followed by a slash (/) and the original group name. If this results in a name collision, a numbered suffix is added to create a unique name. For example, rp2 rp1 (I3) 0 2 becomes rp2 I3/rp1 0 2 after ungrouping.

Figure 7:
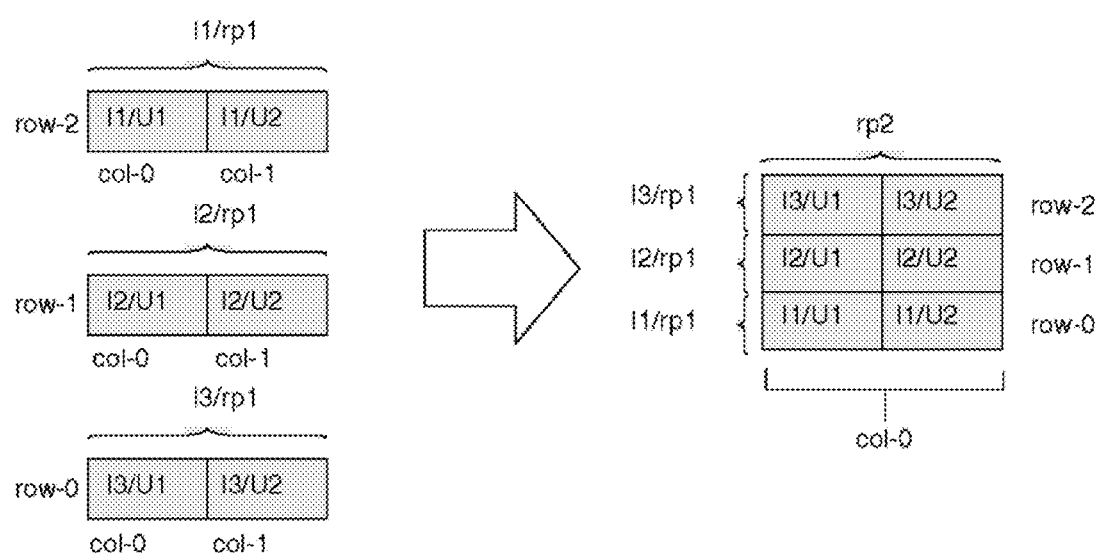
FIG. 7 shows an ungrouped version of the circuit design of FIG. 6.

Using the hierarchical block shown in FIG. 6, the relative placement definition is now as shown in the example below. After ungroup -flatten -all, the resulting ungrouped hierarchical placement block is as shown in FIG. 7.

Example Hierarchical Relative Placement Changed by the ungroup Command create_rp_group I1/rp1 -design mid_design -columns 2 -rows 1
    I1/rp1 -leaf I1/U1 -column 0 -row 0
    I1/rp1 -leaf I1/U2 -column 1 -row 0
create_rp_group I2/rp1 -design mid_design -columns 2 -rows 1
    I2/rp1 -leaf I2/U1 -column 0 -row 0
    I2/rp1 -leaf I2/U2 -column 1 -row 0
create_rp_group I3/rp1-design mid_design -columns 2 -rows 1
    I3/rp1 -leaf I3/U1 -column 0 -row 0
    I3/rp1 -leaf I3/U2 -column 1 -row 0
create_rp_group rp2 -design mid_design -columns 1 -rows 3
    rp2 -hierarchy I1/rp1 -column 0 -row 0
    rp2 -hierarchy I2/rp1 -column 0 -row 1
    rp2 -hierarchy I3/rp1 -column 0 -row 2

Uniquifying Hierarchical Relative Placement

The uniquify command can change each instantiation of hierarchical relative placement structure.

For example, uniquifying

```
group grp_top top 1 2
    hier grp_ripple(U1) 0 0
    hier grp_ripple(U2) 0 1
group grp_ripple ripple
    [ ... ]
``` results in

```
group grp_top top 1 2
    hier grp_ripple_1(U1) 0 0
    hier grp_ripple_2(U2) 0 1
group grp_ripple_1 ripple_1
group grp_ripple_2 ripple_2
```

Adding Keepouts

Hard keepouts can be specified within relative placement blocks. To do this, use the add_to_rp_group command with its -keepout switch.

When defining keepouts, the one or more of the following points can apply:

Keepouts are not objects. A name is to be provided for reference. IN other embodiments, object keepouts are created.

The width and height of a keepout can be specified.

The unit of width for a keepout is the number of placement sites. If the width is not specified, the default width is the width of the widest cell in that column.

The unit of height for a keepout is one row. If the height is not specified, the default height is the height of the tallest cell in that row.

See the syntax provided in "Syntax for Adding a Keepout" and the options summary provided in Table 3.

Example

Figure 8:
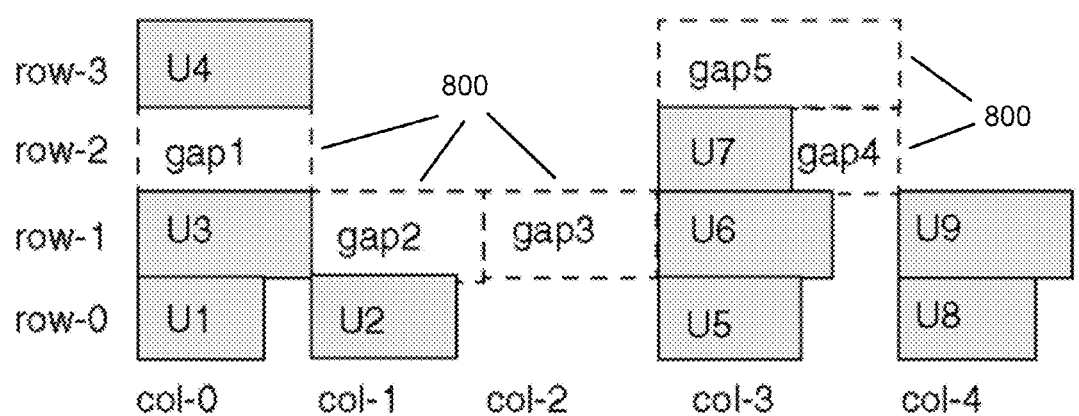
FIG. 8 shows a circuit design with keepouts defined by the relative placement rules.

To create the hard keepout named gap1 shown in FIG. 8, enter psyn_shell-xg-t> add_to_rp_group misc
-keepout gap1
-column 0 -row 2
-width 15 -height 1

FIG. 8 shows a relative placement block containing keepouts 800 (named gap1 ... gap5 in this example). The input to define the keepouts 800 is provided in the example below, following the figure.

The script in the example below provides the definition for the relative placement block containing keepouts shown in FIG. 8.

Example Definition for Relative Placement Input for Defining Keepouts create_rp_group misc -design top -columns 5 -rows 4
    add_to_rp_group misc -leaf U1 -column 0 -row 0 add_to_rp_group misc -leaf U3 -column 0 -row 1
add_to_rp_group misc -keepout gap1 -column 0 -row 2 -width 15 -height 1
add_to_rp_group misc -leaf U4 -column 0 -row 3
add_to_rp_group misc -leaf U2 -column 1 -row 0
add_to_rp_group misc -keepout gap2 -column 1 -row 1 -width 15 -height 1
add_to_rp_group misc -keepout gap3 -column 2 -row 1 -width 10 -height 1
add_to_rp_group misc -leaf U5 -column 3 -row 0
add_to_rp_group misc -leaf U6 -column 3 -row 1
add_to_rp_group misc -leaf U7 -column 3 -row 2
add_to_rp_group misc -keepout gap4 -column 3 -row 2 -width 5 -height 1
add_to_rp_group misc -keepout gap5 -column 3 -row 3 -width 20 -height 1
add_to_rp_group misc -leaf U8 -column 4 -row 0
add_to_rp_group misc -leaf U9 -column 4 -row 1

Creating Relative Placement Structures Containing Multiple Column or Row Positions A cell can occupy multiple column positions or multiple row positions, which is known as straddling. To define straddling, use the inclusion hierarchical relative placement syntax (see "Defining Hierarchical Groups for Inclusion"). When a group is an included group, it can be used once in the design in which it is defined. However, the new group in which it is included can be included or instantiated in another group.

Figure 9:
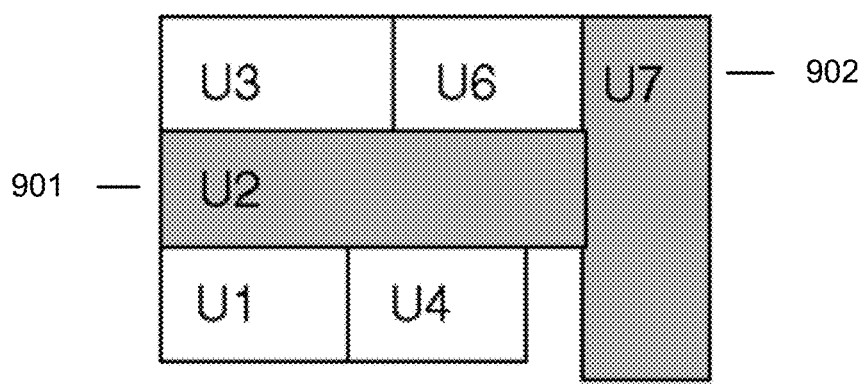
FIG. 9 shows cells that straddle multiple columns and multiple rows as defined by the relative placement rules.

FIG. 9 shows a relative placement group in which cells straddle columns (instance U2 901) and rows (instance U7 902).

The script in the example below provides the definition for the relative placement block shown in FIG. 9.

To construct the hierarchy needed for straddling, the leaf cell groups are defined for rp1, rp2 (the cell that straddles columns 0 and 1), and rp3, then define group rp4 to contain groups rp1, rp2, and rp3. Finally, rp5 is defined to contain group rp4 and leaf cell U7 (the cell that straddles rows 0, 1, and 2).

Example Definition for Relative Placement Input for Hierarchical Placement with Straddling create_rp_group rp1 -design top -columns 2 -rows 1
    add_to_rp_group rp1 -leaf U1 -column 0 -row 0
    add_to_rp_group rp1 -leaf U4 -column 1 -row 0
    create_rp_group rp2 -design top -columns 1 -rows 1
    add_to_rp_group rp2 -leaf U2 -column 0 -row 0
    create_rp_group rp3 -design top -columns 2 -rows 1
    add_to_rp_group rp3 -leaf U3 -column 0 -row 0
    add_to_rp_group rp3 -leaf U6 -column 1 -row 0
    create_rp_group rp4 -design top -columns 1 -rows 3
    add_to_rp_group rp4 -hier rp1 -column 0 -row 0
    add_to_rp_group rp4 -hier rp2 -column 0 -row 1
    add_to_rp_group rp4 -hier rp3 -column 0 -row 2
    create_rp_group rp5 -design top -columns 2 -rows 1
    add_to_rp_group rp5 -hier rp4 -column 0 -row 0
    add_to_rp_group rp5 -leaf U7 -column 1 -row 0

Figure 10:
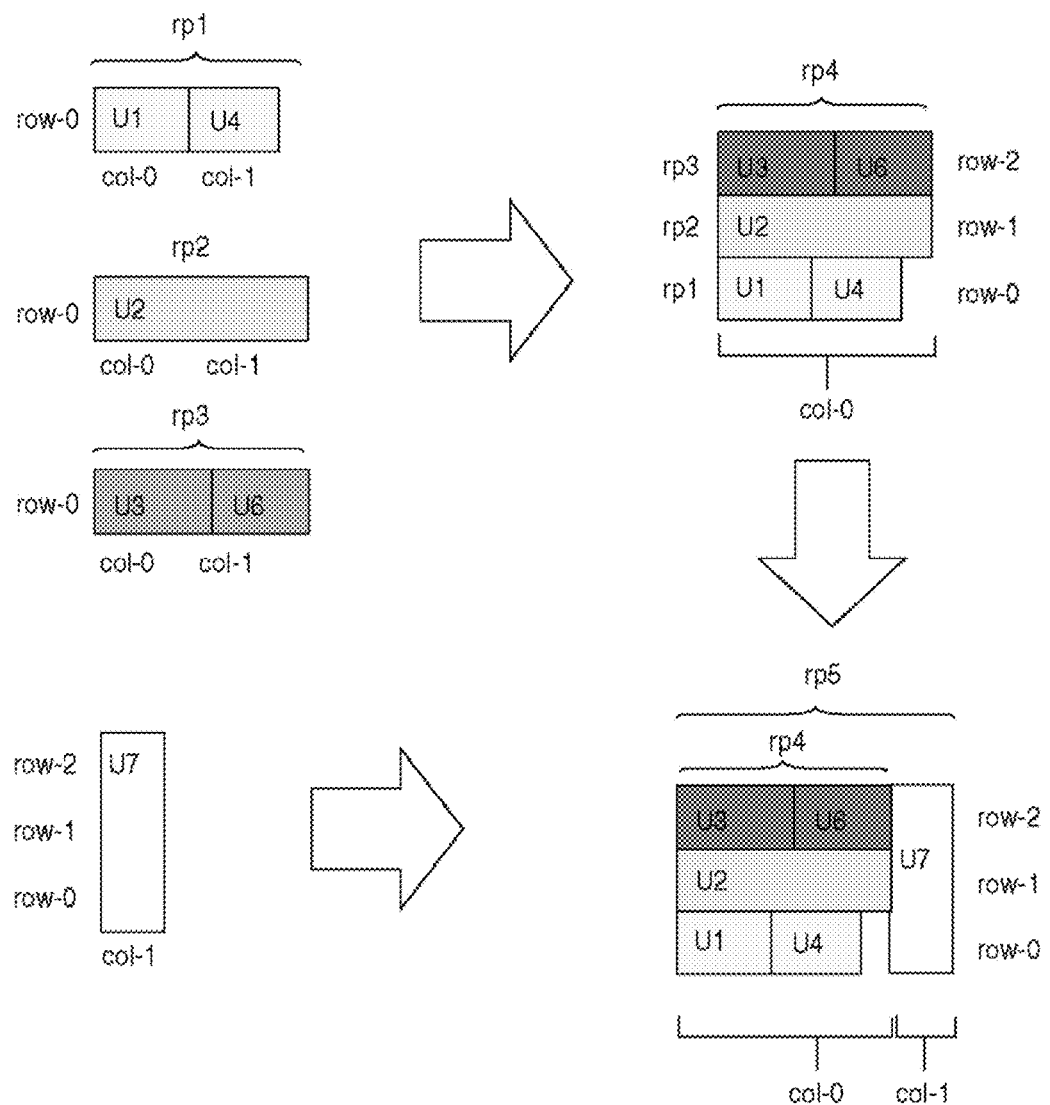
FIG. 10 shows the creation of a hierarchy of circuit elements organized by relative placement rules that permit straddling of multiple rows and multiple columns.

FIG. 10 shows the construction of the hierarchy defined in the example above.

Specifying Orientation for Leaf Cells

By default, the placement, routing, and optimization tool does orientation optimization (automatic orientation) for cells in relative placement groups but orientation can be specified for cells on a per-cell basis, use a mix of user-specified orientation and automatic orientation, or disable orientation on cells in relative placement groups. You cannot specify orientation for a group. In some embodiments, specifying orientation for a group specifies that orientation for all cells of the group.

If an orientation is not specified for a cell, by default, the tool uses either orientation optimization or the default orientation for the cell. Orientation optimization can flip a cell from its default orientation to improve wire length.

To specify orientation for leaf cells, use the add_to_rp_group command with its -orientation switch and the syntax for defining a leaf cell. In addition, direct the placement, routing, and optimization tool is to be directed regarding orientation optimization.

When specifying orientation, one or more of the following points can apply:

Orientation specified has precedence over orientation optimization and default orientation.

If an orientation that is not valid is specified, that orientation is ignored and a valid orientation is used.

Specifying both pin alignment and orientation in the same invocation might be contradictory. Although every attempt is made to honor such a request, honoring both might not be possible. In this case, the orientation specification takes precedence over the pin alignment specification.

If orientation is not specified for a cell and automatic orientation is done, pin alignment is honored.

The syntax is add_to_rp_group group_list -leaf instance_name -column col number -row row number -orientation direction For syntax details, see "Adding Items to a Group".

Directing Orientation Optimization

Orientation optimization can flip a cell to improve relative placement wire length, thereby improving QoR for the design. Orientation optimization is enabled by default.

The physopt_rp_enable_orient_opt variable controls whether orientation optimization is enabled (default true). Orientation optimization is enabled or disabled according to whether to specify the orientation for some cells or disable orientation optimization.

Specifying a Mix of User-Specified Orientation and Automatic Orientation

Orientation can be specified for some cells in a group and automatic orientation allowed for the other cells. To do this, ensure that the physopt_rp_enable_orient_opt variable is set to true (the default).

This ensures that orientations specified are respected and automatic orientation is done for the other cells.

Disabling Orientation Optimization

Orientation optimization can be disabled by setting physopt_rp_enable_orient_opt to false (default is true), for example, when pin alignment is to have precedence.

When this variable is set to false, the specified orientation is respected if the orientation is valid. If no user-specified orientation exists, a default valid orientation is chosen.

Specifying Orientation and Pin Alignment

Both orientation and pin alignment can be specified in the same invocation but doing this might be contradictory.

When used with pin alignment, in various embodiments the priorities for orientation are as follows, in this order:

1. User-specified orientation

When used with pin alignment, orientation has precedence.

2. Orientation optimization

If orientation is not specified for a cell and orientation optimization is done, pin alignment is honored.

3. Default orientation

When used with pin alignment, pin alignment has precedence.

Other embodiments remove, add to, or rearrange the above priorities.

Figure 11:
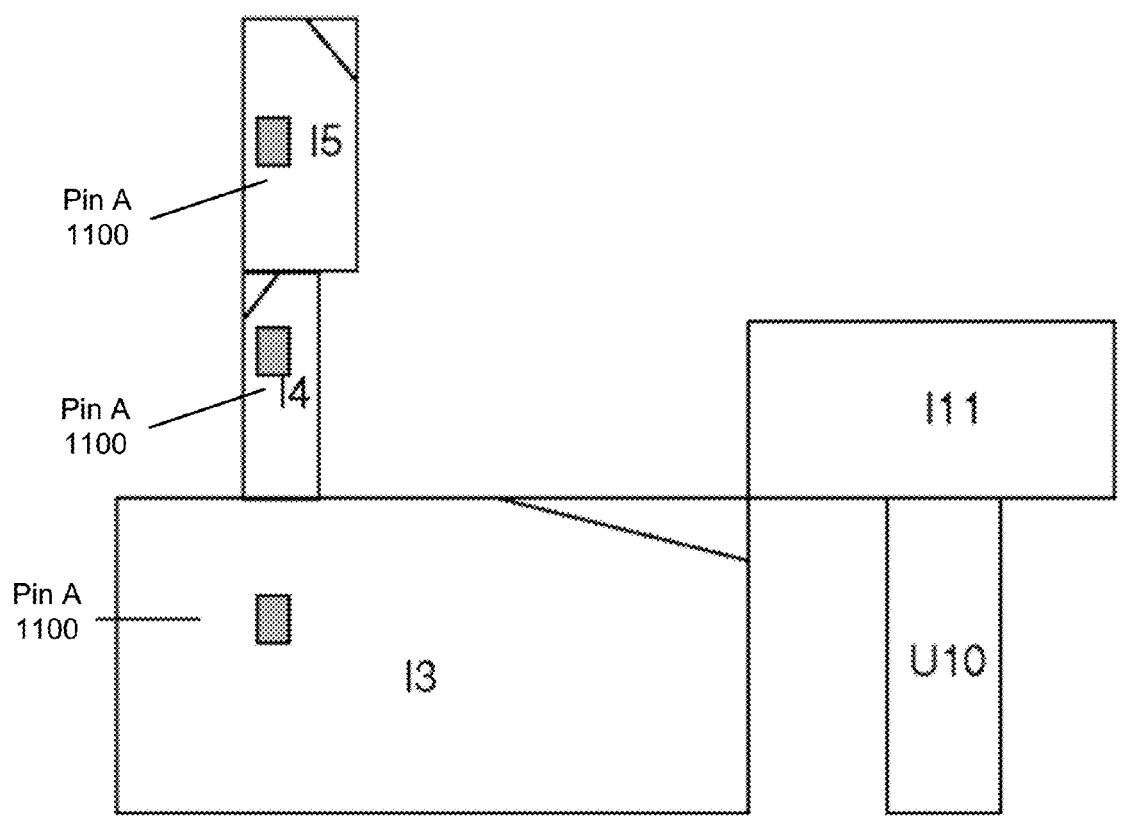
FIG. 11 shows a circuit design organized by relative placement rules with orientation optimization and pin alignment.

FIG. 11 shows orientation optimization used with pin alignment, in particular pin A 1100. In such a case, both orientation and pin alignment are honored. (Not all leaf cells listed in the example that follows the figure are shown in the figure.)

The example below provides the definition for the relative placement shown in FIG. 11.

Example Orientation Optimization Used With Pin Alignment create_rp_group misc1 -design block1 -columns 3 -rows 10 -pin_alignment A
        add-to_rp_group misc1 -leaf I3 -column 0 -row 0 -orientation N
        add-to_rp_group misc1 -leaf I4 -column 0 -row 1 -orientation FN
        add-to_rp_group misc1 -leaf I5 -column 0 -row 2 -orientation N
        add-to_rp_group misc1 -leaf I6 -column 0 -row 3
        add-to_rp_group misc1 -leaf I7 -column 0 -row 4
        add-to_rp_group misc1 -leaf I8 -column 0 -row 5

Writing Relative Placement Information to a Script File

Specified relative placement groups can be written to a named file, creating a Tcl-format script for recreating relative placement groups and their items on the same design. To do this, use the write_rp_group command.

The command returns a collection handle (identifier) of relative placement groups written out. If no objects were written, the empty string is returned.

To use the write_rp_group command, enter psyn_shell-xg-t> write_rp_group [options]

| To do this | Use this |
| --- | --- |
| List the groups to write to the script, (vs. using -all). | group_list |
| Write all the relative placement groups to the script, (vs. using a group list or -hierarchy). | -all |
| Write all the relative placement groups within the hierarchy of the relative placement groups. By omitting this option, subgroups are not written. | -hierarchy |
| Disable line splitting when information exceeds the column width. | -nosplit |
| Write the script to the specified file. By omitting this option, the information is written to the screen. | -output |

Example

To save all the relative placement groups to disk, remove the information from the design, then recreate the information on the design, enter

```
psyn_shell-xg-t> find rp_group
{mul::grp_mul ripple::grp_ripple example3::top_group}
psyn_shell-xg-t> write_rp_group -all -output my_groups.tcl
1
psyn_shell-xg-t> remove_rp_group -all -quiet
1
psyn_shell-xg-t> find rp_group
Error: Can't find objects matching '*'. (UID-109)
psyn_shell-xg-t> source my_groups.tcl
{example3::top_group}
psyn_shell-xg-t> find rp_group
{example3::top_group ripple::grp_ripple mul::grp_mul}
```

Aligning Relative Placement by Pins

Columns can be aligned by pins instead of by the lower-left corner (the default). This capability increases the probability of straight routes and can result in less congestion, lower power, and lower routing resources by eliminating vias.

To align a group by pins, use the create_rp_group command with its -pin_align_name switch.

When aligning by pins, one or more of the following points can apply:

When specifying a pin name, the tool determines the location for that pin in cells in the column, then aligns the column based on the pin locations.

If cells in a column do not have the pin specified, the column is aligned as follows:

If some cells in a column do not have the pins specified, those cells are aligned with a default position (e.g., the lower-left corner) and an information message appears.

If no cells in a column have the pins specified, the cells are aligned with a default position (e.g., the lower-left corner) and a warning appears.

Aligning by pins can result in empty space between columns.

Both pin alignment and orientation can be specified in the same invocation but doing this might be contradictory. Although every attempt is made to honor such a request, honoring both might not be possible. In this case, the orientation specification takes precedence over the pin alignment specification.

The widest cell in the column determines the width of the column.

Figure 12:
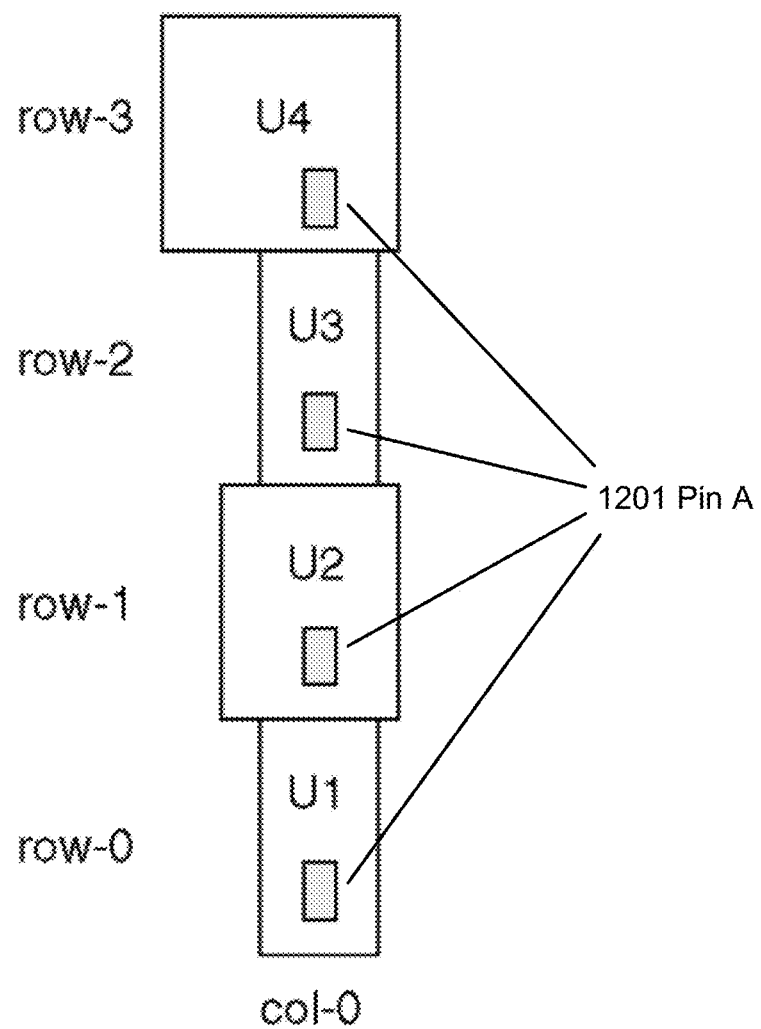
FIG. 12 shows a relative placement group of a circuit design aligned by pins.

FIG. 12 shows a relative placement group aligned by pins.

The script in the example below defines the relative placement group shown in FIG. 12, which is aligned by pin A 1201.

Example Definition for Relative Placement Group Aligned by Pins create_rp_group rp1 -design pair_design -columns 1 -rows 4 -pin_align_name A
        add_to_rp_group rp1 -leaf U1 -column 0 -row 0
        add_to_rp_group rp1 -leaf U2 -column 0 -row 1
        add_to_rp_group rp1 -leaf U3 -column 0 -row 2
        add_to_rp_group rp1 -leaf U4 -column 0 -row 3

Figure 13:
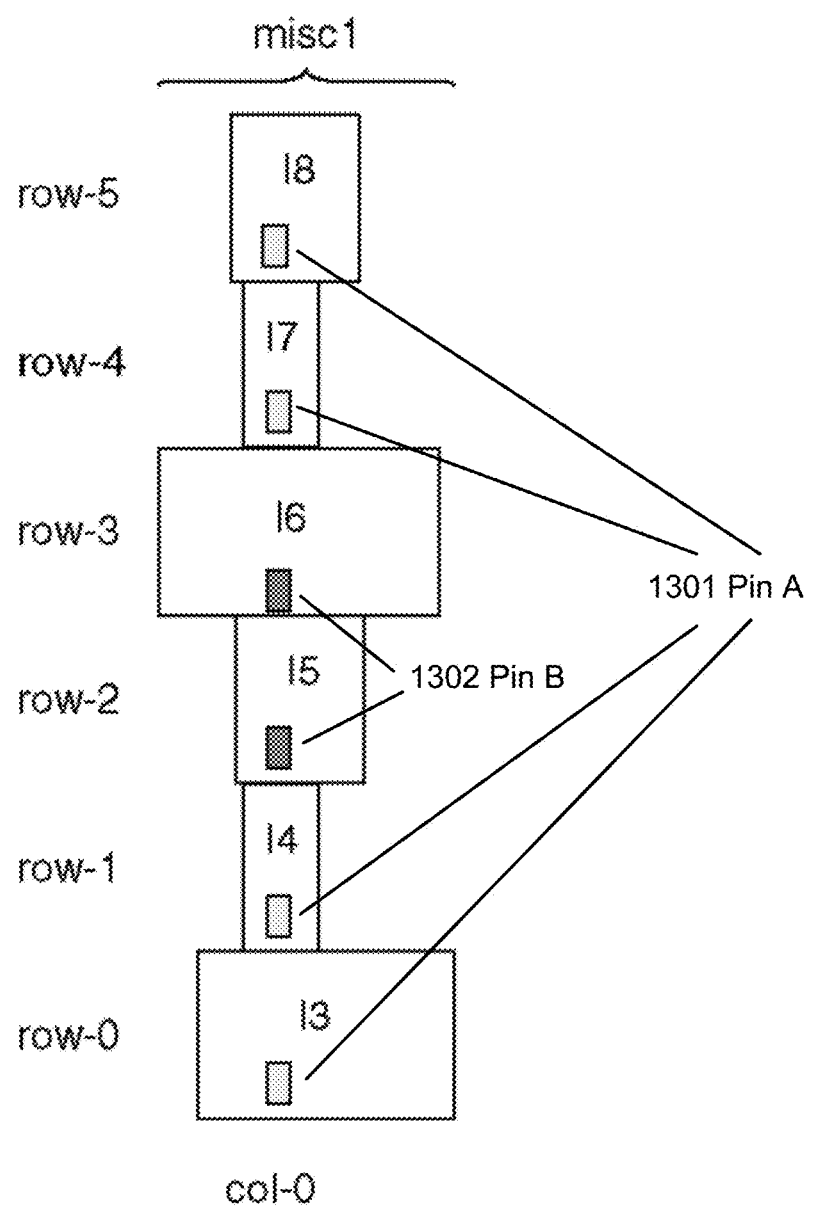
FIG. 13 shows a relative placement group of a circuit design aligned by multiple pins.

A column can be aligned within a placement group by a specified pin and align cells within the column by a different pin as shown in FIG. 13, with pin A 1301 and pin B 1302. The alignment pin name specified for particular cells in the column overrides the alignment pin name specified for the group.

A set of cells can be specified to align over specified pins. For example, pins A and B can be aligned in a group by specifying a different pin alignment name for some cells.

The script in the example below defines the relative placement group shown in FIG. 13. In the example, the group misc1 is aligned by pin A and instances I5 and I6 within the group are aligned by pin B, overriding the group pin alignment name A for those instances.

Example Definition to Align a Group and Leaf Cells by Pins create_rp_group misc1 -design block1 -columns 3 -rows 10 -pin_align_name A
        add_to_rp_group misc1 -leaf I3 -column 0 -row 0
        add_to_rp_group misc1 -leaf I4 -column 0 -row 1
        add_to_rp_group misc1 -leaf I5 -column 0 -row 2 -pin_align_name B
        add_to_rp_group misc1 -leaf I6 -column 0 -row 3 -pin_align_name B
        add_to_rp_group misc1 -leaf I7 -column 0 -row 4
        add_to_rp_group misc1 -leaf I8 -column 0 -row 5

Figure 14:
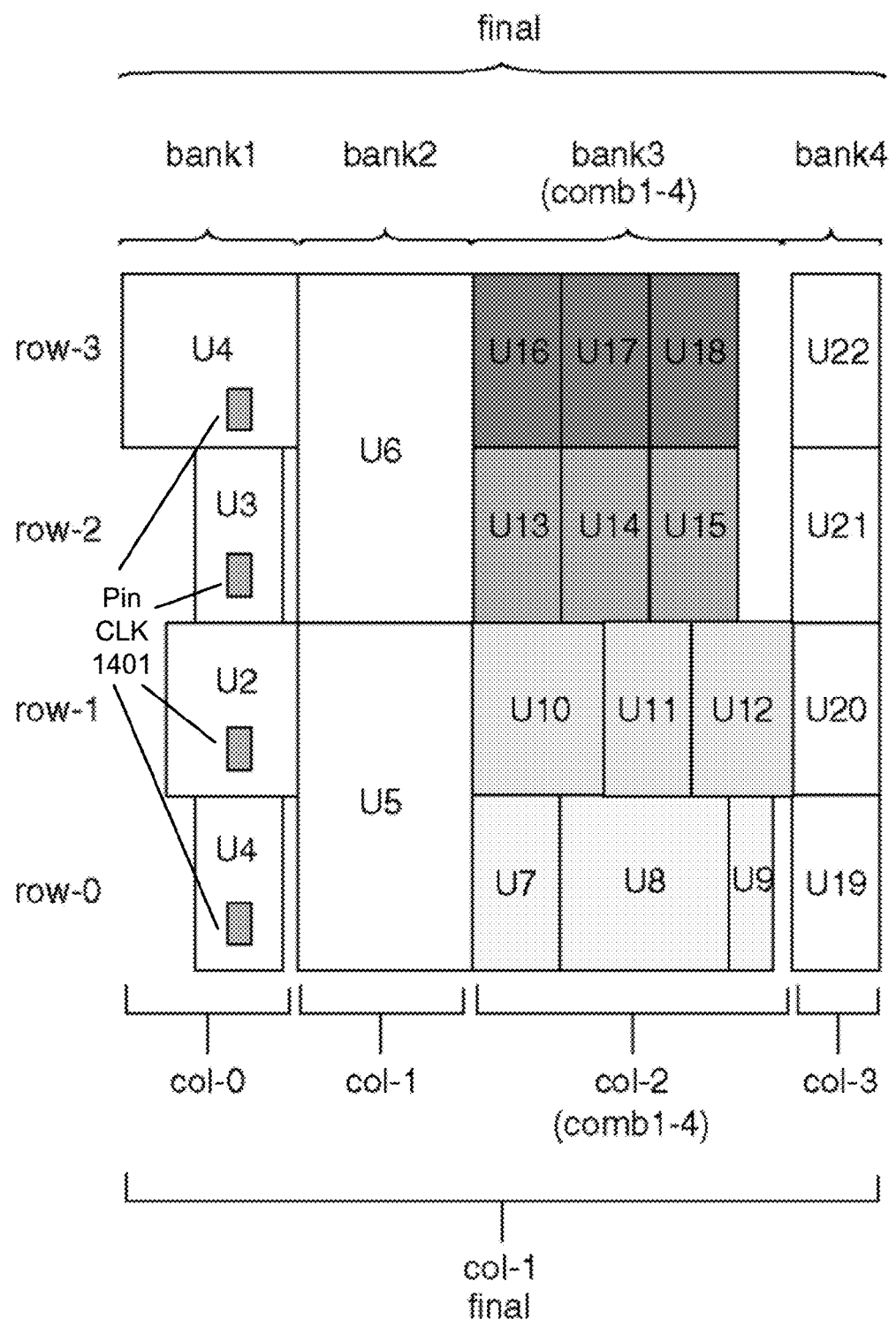
FIG. 14 shows a relative placement block of a circuit design that contains a group aligned by pins.

FIG. 14 shows a relative placement block that contains a group aligned by pins, in particular pin CLK 1401—the column named bank1 (col 0). It is included in the group named final. Group final can also be used further for instantiation or inclusion in another group.

The script in the example below provides the definition for the relative placement block shown in FIG. 14.

Example Definition for Hierarchical Relative Placement Block with Column Aligned by Pins

```
create_rp_group bank1 -design top -columns 1 -rows 4 -pin_name clk
    add_to_rp_group bank1 -leaf U1 -column 0 -row 0
    add_to_rp_group bank1 -leaf U2 -column 0 -row 1
    add_to_rp_group bank1 -leaf U3 -column 0 -row 2
    add_to_rp_group bank1 -leaf U4 -column 0 -row 3
create_rp_group bank2 -design top -columns 1 -rows 2
    add_to_rp_group bank2 -leaf U5 -column 0-row 0
    add_to_rp_group bank2 -leaf U6 -column 0-row 1
create_rp_group bank4 -design top -columns 1 -rows 4
    add_to_rp_group bank4 -leaf U19 -column 0 -row 0
    . . .
    add_to_rp_group bank4 -leaf U22 -column 0 -row 3
create_rp_group comb1-design top -columns 3 -rows 1
    add_to_rp_group comb1 -leaf U7 -column 0 -row 0
    add_to_rp_group comb1-leaf U8 -column 1 -row 0
    add_to_rp_group comb1-leaf U9 -column 2 -row 0
create_rp_group comb2 -design top -columns 3 -rows 1
    add_to_rp_group comb2 -leaf U10 -column 0 -row 0
    add_to_rp_group comb2 -leaf U11 -column 1 -row 0
    add_to_rp_group comb2 -leaf U12 -column 2 -row 0
create_rp_group comb3 -design top -columns 3 -rows 1
    add_to_rp_group comb3 -leaf U13 -column 0 -row 0
    add_to_rp_group comb3 -leaf U14 -column 1 -row 0
    add_to_rp_group comb3 -leaf U15 -column 2 -row 0
create_rp_group comb4 -design top -columns 3 -rows 1
    add_to_rp_group comb4 -leaf U16 -column 0 -row 0
    add_to_rp_group comb4 -leaf U17 -column 1 -row 0
    add_to_rp_group comb4 -leaf U18 -column 2 -row 0
create_rp_group bank3 -design top -columns 1 -rows 4
    add_to_rp_group bank3 -hierarchy comb1 -column 0 -row 0
    add_to_rp_group bank3 -hierarchy comb2 -column 0 -row 1
    . . .
create_rp_group final -design top -columns 4 -rows 1
    add_to_rp_group final -hierarchy bank1 -column 0 -row 0
    add_to_rp_group final -hierarchy bank2 -column 1 -row 0
    add_to_rp_group final -hierarchy bank3 -column 2 -row 0
    add_to_rp_group final -hierarchy bank4 -column 3 -row 0
```

Anchoring Relative Placement Blocks at a Specified Location

A single relative placement block can be anchored at a location specified. Anchoring allows controlled placement of the relative placement block with respect to other relative placement blocks, macros, or to the edges and origin of the core area.

To anchor a relative placement group, use the create_rp_group command with its -x_offset and -y_offset switches.

When specifying an anchor point, one or more of the following points can apply:

Provide anchor points for top level groups. Anchor points are allowed at the top level.

Both the x- and y-coordinates or either the x- or y-coordinate can be specified. Specifying one coordinate as fixed allows the unspecified coordinate to slide. The offset is an integer, in microns, relative to the chip's origin.

If an anchor point outside the design boundary is specified, relative placement alignment for the block fails, a warning appears, and the cells are clustered inside the boundary.

If an anchor point is specified for a group that is not a top-level group or that causes placement that is not valid, a warning appears and relative placement continues.

Figure 15:
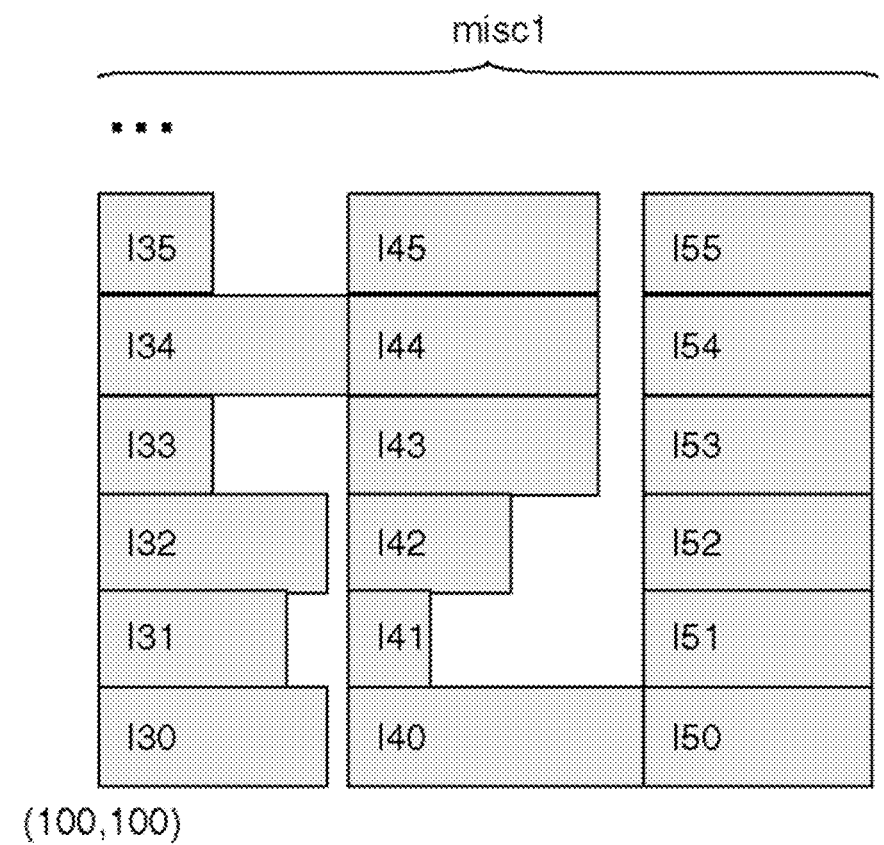
FIG. 15 shows a relative placement block of a circuit design anchored at the x-coordinate and the y-coordinate.

FIG. 15 shows a relative placement block anchored at both the x-coordinate and the y-coordinate.

The script in the example below provides the definition for anchoring relative placement block misc1 in block 1 at both x-coordinate 100 and y-coordinate 100. (In both the figure and the example, not all rows are shown.)

Example Definition for Anchoring a Group Using Two Coordinates

```
create_rp_group misc1 -design block1 -columns 3 -rows 10 -x_offset 100 -y_offset 100
    add_to_rp_group misc1 -leaf I30 -column 0 -row 0
    add_to_rp_group misc1 -leaf I31 -column 0 -row 1
    add_to_rp_group misc1 -leaf I32 -column 0 -row 2
    add_to_rp_group misc1 -leaf I33 -column 0 -row 3
    add_to_rp_group misc1 -leaf I34 -column 0 -row 4
    add_to_rp_group misc1 -leaf I35 -column 0 -row 5
    . . . .
```

Figure 16:
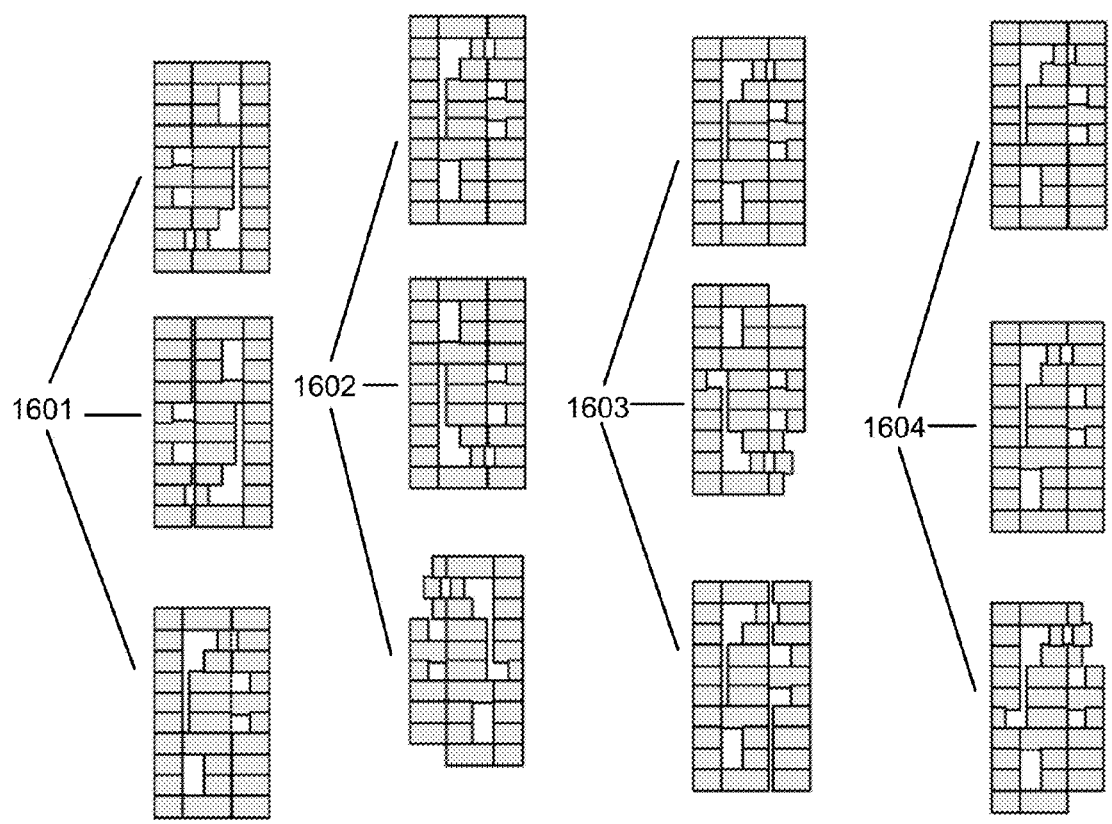
FIG. 16 shows multiple relative placement blocks of a circuit design aligned and anchored vertically at four coordinates.

FIG. 16 shows 12 relative placement blocks aligned and anchored vertically at four coordinates. Blocks 1, 2, and 3 1601 have -x_offset 100. Blocks 4, 5, and 6 1602 have -x_offset 200. Blocks 7, 8, and 9 1603 have -x_offset 300. Blocks 10, 11, and 12 1604 have -x_offset 400.

The script in the example below defines the locations of the 12 vertically aligned and anchored relative placement blocks shown in FIG. 16. For brevity, not every group is listed in the example.

Example Definitions for Locations of Vertically Aligned and Anchored Blocks

```
create_rp_group block1 -design misc1 -columns 3 -rows 10 -x_offset 100
create_rp_group block2 -design misc1 -columns 3 -rows 10 -x_offset 100
create_rp_group block3 -design misc1 -columns 3 -rows 10 -x_offset 100
create_rp_group block4 -design misc1 -columns 3 -rows 10 -x_offset 200
create_rp_group block5 -design misc1 -columns 3 -rows 10 -x_offset 200
create_rp_group block6 -design misc1 -columns 3 -rows 10 -x_offset 200
. . .
create_rp_group block12 -design misc1 -columns 3 -rows 10 -x_offset 400
```

Using Compression to Remove Empty Space in a Relative Placement Group

By default, construction for relative placement aligns cells from their bottom-left corner. Compression removes empty space in rows to create a more compact structure. The compressed columns are no longer aligned and utilization is higher in the area of the compressed cells.

If compression is needed, use hierarchical relative placement to construct the pattern, using the syntax for hierarchical inclusion.

Figure 17:
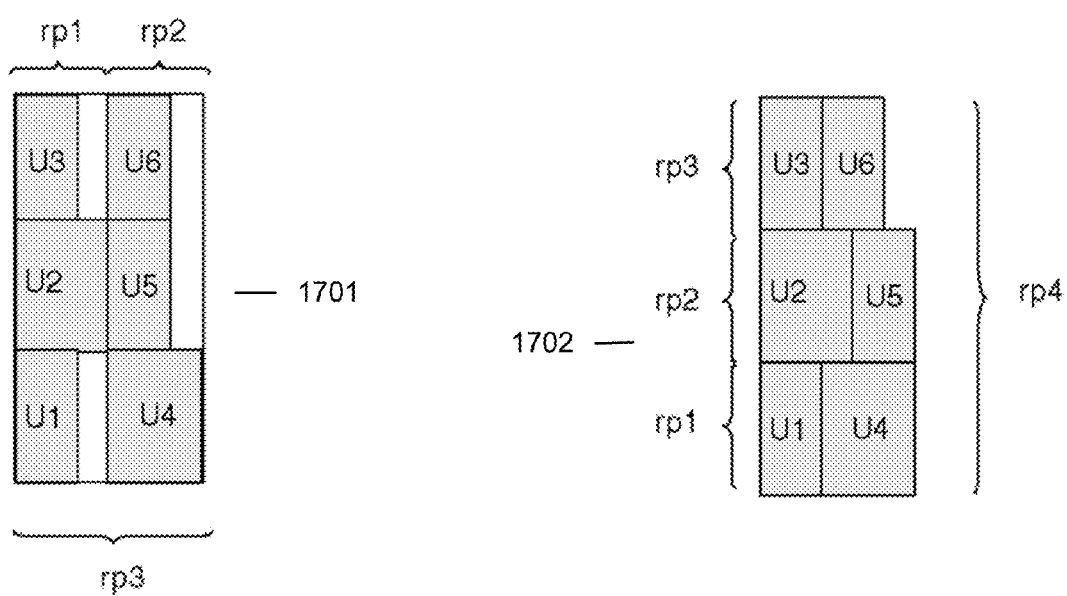
FIG. 17 shows circuit elements with and without compression specified by relative placement rules.

FIG. 17 shows the same cells aligned without compression 1701 and with compression 1702. The cells are bottom-left aligned.

Alternatively, compression can be accomplished by using bit-stack placement. Set the variable physopt_bit_stacked_placement to true (the default is false). Setting this variable to true causes the empty space to be removed, compressing the group as shown in FIG. 17. The columns are no longer aligned and utilization is higher.

Relative Placement in a Design Containing Obstructions

During placement, relative placement groups can avoid placement keepouts (obstructions) that are defined in the PDEF file or created by a the placement, routing, and optimization tool keepout command (create_placement_keepout, create_wiring_keepout). A relative placement group can be broken into pieces that straddle obstructions.

Figure 18:
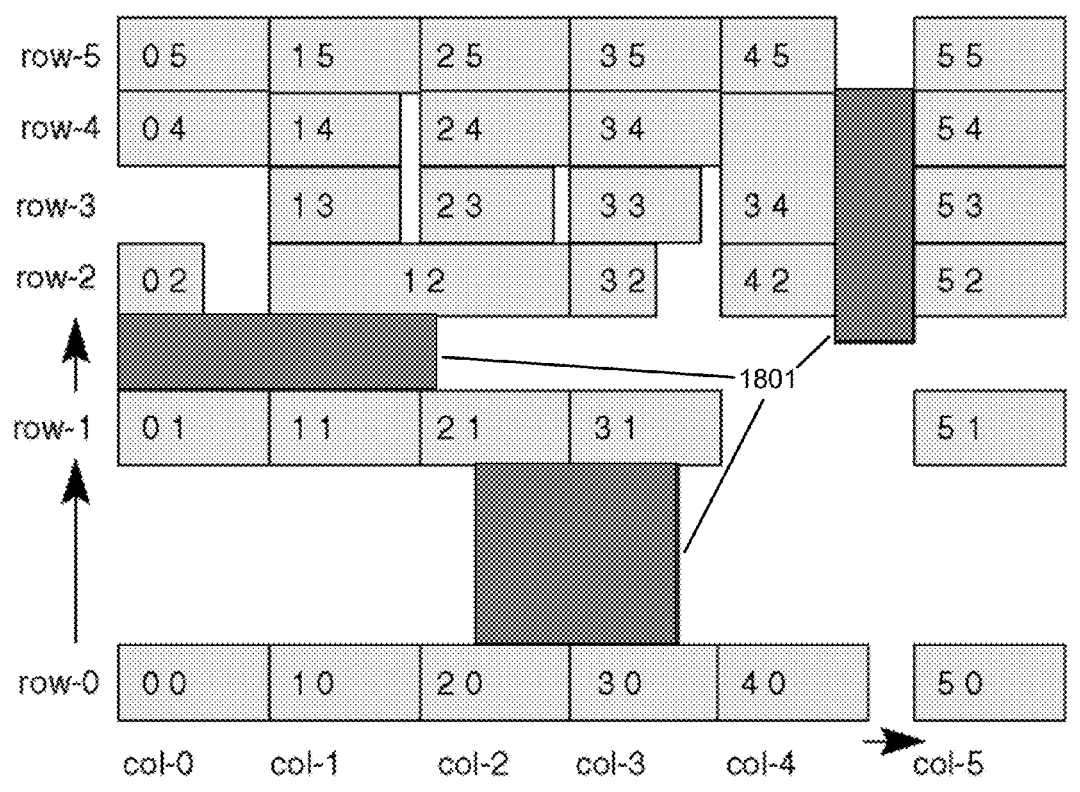

FIG. 18 shows the placement of relative placement cells in a design containing keepouts 1801 that were either defined in the PDEF file or created by a the placement, routing, and optimization tool keepout command. Rows 0 and 2 and column 5 are placed to avoid the keepouts but relative placement alignment is maintained.

Converting Rp_Reader Syntax to Tcl Syntax

Use the following transformations to convert existing rp_reader text files to Tcl syntax to use within the placement, routing, and optimization tool:

- Change the keyword group to the create_rp_group command
- Insert the add_to_rp_group command before each item in a group
- Change the keyword keepout to -keepout
- Change the keyword hierarchy to -hierarchy
- Change the keyword leaf to -leaf
- Insert the -design switch before the design name when creating a relative placement group
- Insert the -column and -row switches in front of those values
- Insert the -width and -height switches in front of those values Alternatively, the following command can be used that runs a script to do the conversion:

rp_reader dbfile out.tcl -tel_export

The following tables show the rp_reader file format elements for groups, leaf cells, hierarchy groups, and keepouts.

Group

| group keyword | misc group name | top design name | 9 number of columns | 10 number of rows |
|---|---|---|---|---|

Leaf Cell

| custom group name | leaf keyword | U0 instance name | 0 column position | 0 row position |
|---|---|---|---|---|

Hierarchy Group for Inclusion

| rp4 group name | hier keyword | rp1 subgroup name | 0 column position | 0 row position |
|---|---|---|---|---|

Hierarchy Group for Instantiation

| rp2 group name | hier keyword | rp1 subgroup name | (U3) instance name | 0 column position | 0 row position |
|---|---|---|---|---|---|

Keepout

| misc group name | keep keyword | gap4 keepout name | 3 column position | 2 row position | 5 width | 1 height |
|---|---|---|---|---|---|---|

Automatic Relative Placement Rules at RTL-Level

Relative placement rules can be generated the RTL-level. RP takes advantage of inherent structure at the RTL-level of behavioral description, in addition to at the netlist cell level.

When relative placement rules can be generated at the RTL-level, the RP constraints are not required to be specific to the netlist, as the RP constraints are not required to be tied to the instance names of the cells in the netlist. Thus, every time a new netlist is synthesized, and the netlist has different instance names from a previously synthesized netlist despite functionally identical designs, the RP constraints are not invalidated and need not be re-written to reference new cell instance names. This process is easily repeatable. RP constraints at the RTL-level are portable even when a new netlist is created through additional synthesis.

When relative placement rules can be generated at the RTL-level, then corresponding RP constraints at the cell instance level do not have to be written. This saves time, because writing RP constraints at the cell instance level is a very detailed and tedious task.

This technology focuses on RP specification on high level RTL constructs and subsequent automatic cell level RP generation from the specification. It frees the user from writing the cell level RP constraints and rewriting them when the design is re-synthesized. The solution also has the full implementation flow support from RTL synthesis to place and route.

In one example design flow, an RTL hardware description is processed by a synthesis tool such as Synopsys Design Compiler into a netlist. The synthesis tool automatically creates RTL-level RP rules. When the synthesis tool creates the netlist, the corresponding netlist-level RP rules are automatically created based on the RTL-level RP rules. A place and route and optimization tool such as Synopsys IC Compiler then generates the placed, routed, and optimized design from the netlist and the netlist-level RP rules. Generated netlist-level RP rules are automatically updated reflecting name changes when composing cells when design hierarchy is being ungrouped, uniquified, change_named or change_linked.

The RP constraints are propagated to synthesis and place and route tools such as DCT and ICC.

Placement of Clock Single-Bit and Multi-Bit Flip-Flops

Various embodiment address one or more of: replacing the groups of single-bit flops with multi-bit flops and/or creating one or more relative placement groups for the same group of single-bit flops, and one of identifying such groups of flops to replace.

Although replacement of a group of single-bit flops by multi-bit flop reduces total clock net length, the replacement can also increase signal wire-length. An increase of signal-wire length can create issues on the timing of critical paths. Thus, to avoid impacting timing critical paths, sufficient timing slacks are used with multi-bit flip-flops. Sufficient information is available about timing slacks at the post-placement stage. Accordingly some embodiments address the problem at post placement stage. Other embodiments map the RTL design to gate level design with multi-bit flip-flops, or create relative placement groups at the RTL level.

At the post-placement stage, single bit flip-flops are identified which can be converted to one or more multi-bit flip-flop. Also, groups of single-bit flip-flops are formed with clustering algorithms as used in CTS. With the groups of flip-flops, relative placement groups are created, and/or or the single-bit flip-flops are replaced by multi-bit flip-flops.

Depending on design success or failure with design goals such as timing, distance cost functions, and power, one or more relative placement groups can be converted to one or more multi-bit flip-flops, and/or one or more multi-bit flip-flops can be decomposed to single-bit flip-flops (which can be converted to a relative placement group), depending on timing optimization or congestion demands.

Disclosed are examples of ways to identify groups of single-bit flops and either converting them to multi-bit flops or creating relative placement groups and rules for them. Timing optimization may demand further adjustments. A relative placement group of single-bit flip-flops can be converted to one or more multi-bit flop; or a multi-bit flop can be split and converted to a relative placement group. Another metric is the generation of a fast solution in the context of the overall placement/optimization flow, and support of incremental generation of such multi-bit flops and relative placement groups or banks.

One example algorithm takes a number of input files from user. The example below uses two files, an Input_map_file and a Function_group_map file. Alternatively, the input files may be combined or further divided.

The Input_map_file instructs the tool about how to replace what the tool identifies a group of "n" single bit registers.

An example format of the file is:

```
# bits { number_of_instances multibit_reference_library_cell_name }
2 { 1 MREG2 }
......
4 { 1 MREG4 }
4 { 1 MREG4N }
...
6 { 1 MREG2 } { 1 MREG4 }
6 { 1 MREG2N } { 1 MREG4N }
......
```

The Function_group_map_file provides information about functional groups.

An example format of the file is:
group_name    no_of_lib_cells_forming_group    lib_cell_name multibit-lib_cell_name Reg_group_1 4 {REG1 REG2 REG3 REG4} {MREG2 MREG4}

Reg_group_2 3 {REG5 REG6 REG1} {MREG2N MREG4N}

In one example, the tool does not group single bit cells with library cells across different functional group. When the tool identifies a group of single-bit flops to be replaced, and identifies the substitute multi-bit flops that replace the single-bit flops, then library cells of those multi-bit flops are in one Reg_group. As part of the replacement procedure, the tool chooses multi-bit reference cells from within that function-group.

An example algorithm:
1. Start with a placed net-list.
2. Scan for integrated clock gating cells (ICGs) and root-clocks in the netlist.
3. Collect valid leaf-level clock sinks from ICGs.
4. Collect valid leaf-level clock sinks from root-clocks.

Steps 3 and 4 can be switched; the objective is that in combination, steps 3 and 4 collectively find the clock sinks 5. Leaf cells rooted to a same ICG/root-clock are identified as one group of cells.

6. Placement of netlist is results in sufficiently accurate timing numbers. Find timing critical clock sinks in design, and filter those out from collected clock sinks
7. Filter out cells which are identified for exclusion by user.
8. Recursively further subgroup a group of clock sinks, depending on the following:
  a. Clock sinks in a subgroup should belong to same hierarchy.
  b. Clock sinks in a subgroup should be part of same scan chain.
  c. Clock sinks in a subgroup should be part of same functional-group, specified by user.
  d. Clock sinks in a subgroup should have same control ports, such as reset/enable.
9. Invoke clock-tree-clustering (CTC) for a sub-group to find cluster of flops. CTC uses the placement information of flops.
10. Each cluster of flops returned by CTC is a candidate for replacement by multi-bit flop, of a relative placement group of the cluster of flops.
11. Since all the flops of a cluster of flops belong to one function-group, the same function-group is used for choosing a replacement multi-bit flop.
12. The particular multi-bit reference cell that replaces that particular cluster of flops is identified by correct function-group, number of single-it flops in the cluster, and input_map_file.
13. Automatically, the tool generates a command identifying which single bit registers to be replaced, by which multi-bit ref cell. Or the tool generates the relative placement group for those single-bit flops.

Figure 19:
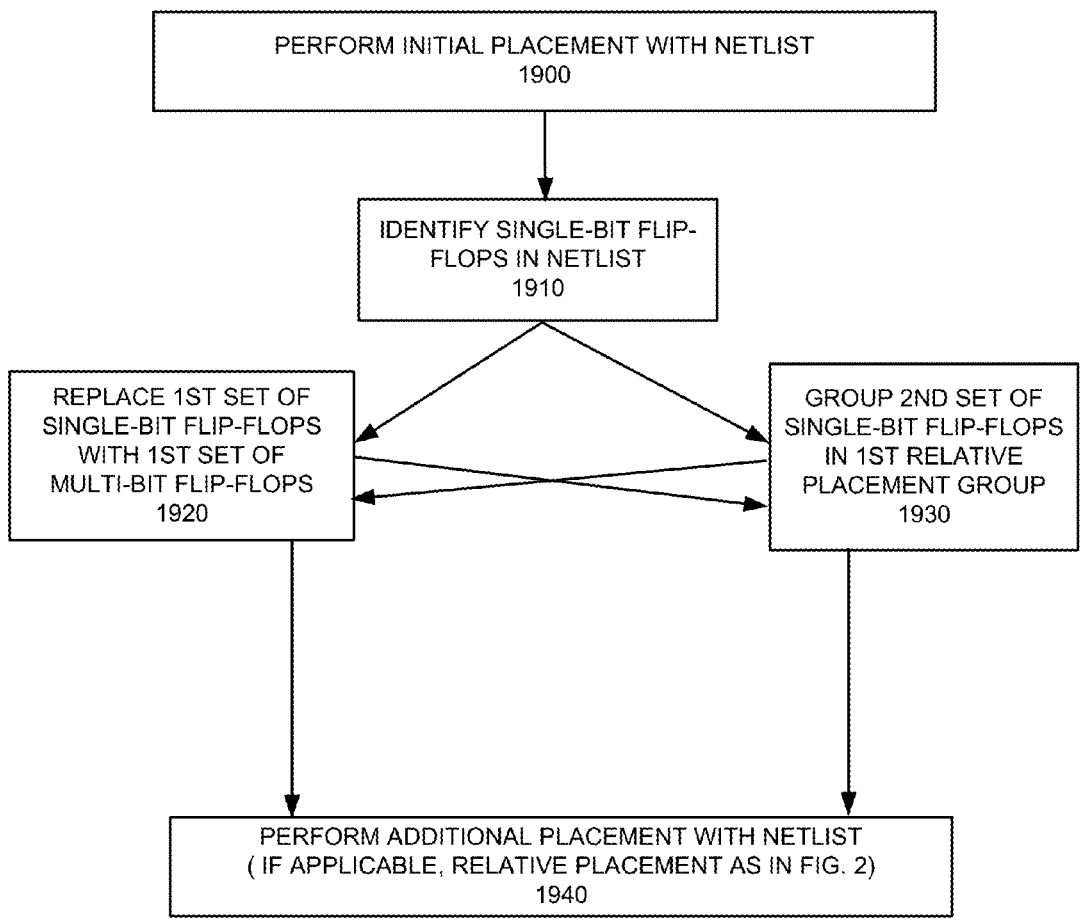
FIGS. 19-21 are flow diagrams illustrating a first exemplary process of replacement of single-bit flip-flops, by one or more multi-bit flips-flops and/or one or more relative placement groups of single-bit flip-flops, which as applicable, modifies the process flow of FIG. 2.
Figure 20:
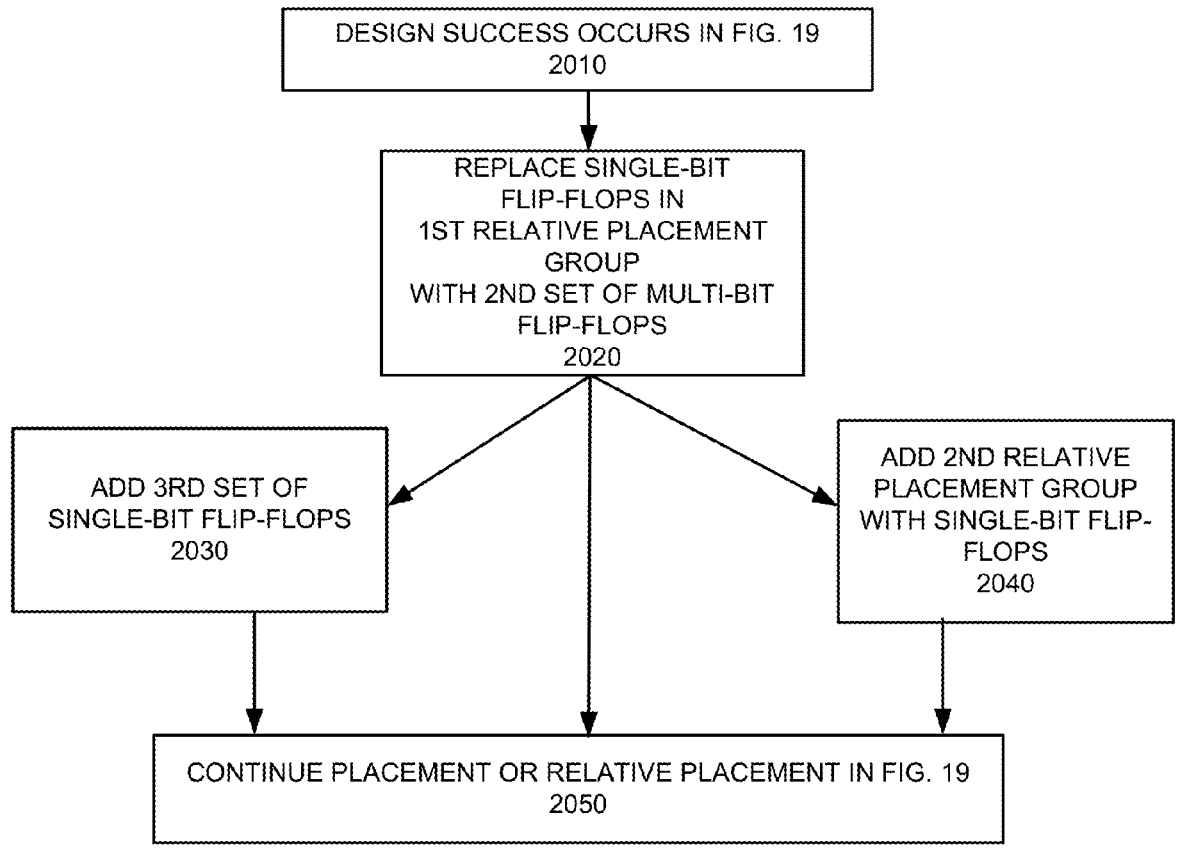
Figure 21:
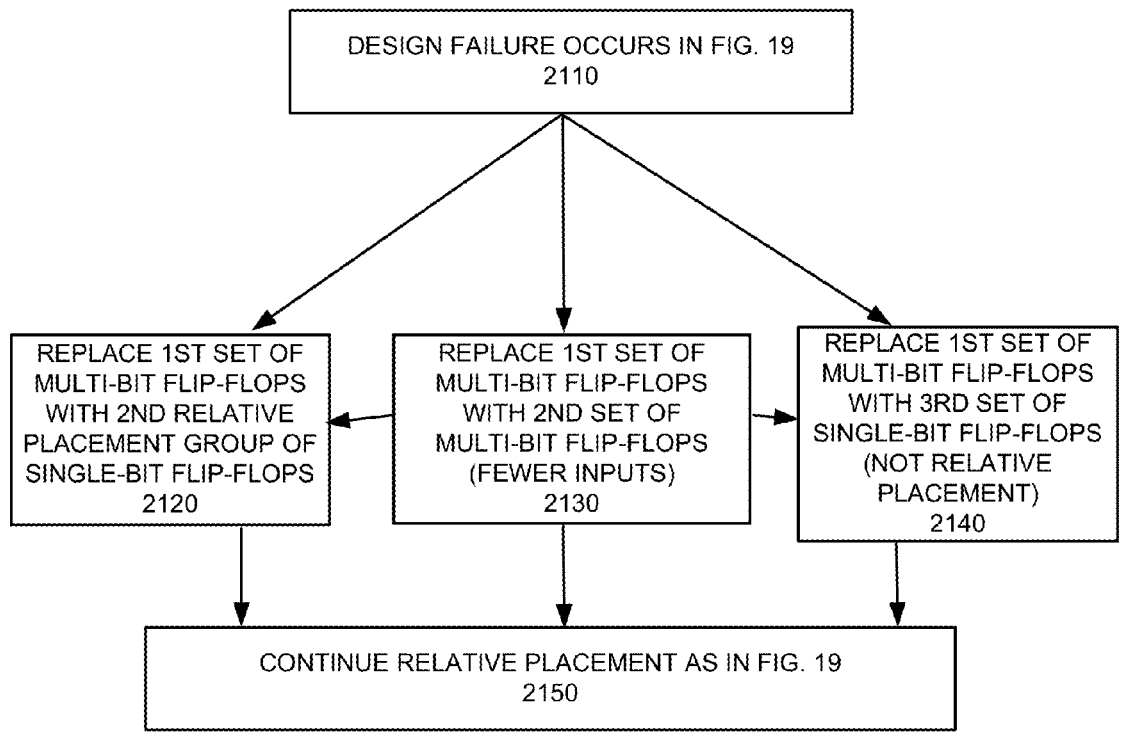

FIGS. 19-21 are flow diagrams illustrating a first exemplary process of replacement of single-bit flip-flops, by one or more multi-bit flips-flops and/or one or more relative placement groups of single-bit flip-flops, which as applicable, modifies the process flow of FIG. 2.

FIG. 19 starts with an initial placement 1900 with a netlist. The placement may also be another placement subsequent to the initial placement with the netlist. In 1910, single-bit flip-flops in the netlist are identified, such as with the CTC techniques described above.

Next in 1920, in one embodiment, a first set of single-bit flip-flops is replaced with a first set of multi-bit flip-flops. Then, in 1930, a second set of single-bit flip-flops is grouped into a first relative placement group. The arrows indicate that the order may be switched, such that 1930 is performed, and then 1920 is performed. In either case, the process flow continues with 1940, where additional placement with the netlist is performed. If applicable, the additional placement is performed according to the relative placement as shown in FIG. 2.

FIG. 20 supplements the process flow in FIG. 19 with a design success 2010, such as with timing, power, and routability constraints. In 2020, single-bit flip-flops in the first relative placement group are replaced with a second set of multi-bit flip-flops. Because multi-bit flip-flops have advantages such as reduced power, ongoing design success indicates that the design may be further improved with such replacement.

FIG. 20 has further options depending on whether the multi-bit flops have a corresponding size to replace all of the single-bit flip-flops. In the event that all of the single-bit flip-flops are replaced by the multi-bit flip-flops, the process continues with 2050, further placement or relative placement. However, there may be leftover single-bit flip-flops that were not replaced. In 2030, such leftover single-bit flip-flops can be added as a third set of single-bit flip-flops. Or, in 2040, such leftover single-bit flip-flops can be added as a second relative placement group. Then, the process continues with 2050, further placement or relative placement.

FIG. 21 supplements the process flow in FIG. 19 with a design failure 2110, such as with timing, power, and routability constraints. In 2130, the first set of multi-bit flip-flops are replaced with a second set of multi-bit flip-flops, such as with fewer inputs. Ongoing design failure indicates that the design may benefit from a reduced size of the multi-bit flip-flops. However, because multi-bit flip-flops have advantages such as reduced power, the multi-bit flip-flops are shrunk rather than discarded.

FIG. 21 has further options depending on whether the smaller multi-bit flops have a corresponding size to replace all of the larger multi-bit flip-flops. In the event that all of the larger multi-bit flip-flops are replaced by smaller multi-bit flip-flops, the process continues with 2150, further placement or relative placement. However, the replacement may be incomplete, or there may be a preference for single-bit flip-flops, or one or more of the multi-bit flip-flops may be 2-bit flip-flops which can be decomposed into only single-bit flip-flops. In 2120, incomplete replacement can be addressed with a second relative placement group of single-bit flip-flops. Or, in 2140, incomplete replacement can be addressed with a third set of single-bit flip-flops (non-relative placement). Then, the process continues with 2150, further placement or relative placement.

In another embodiment, step 2130 is skipped entirely, and step 2110 continues with step 2120 and/or step 2140.

Figure 22:
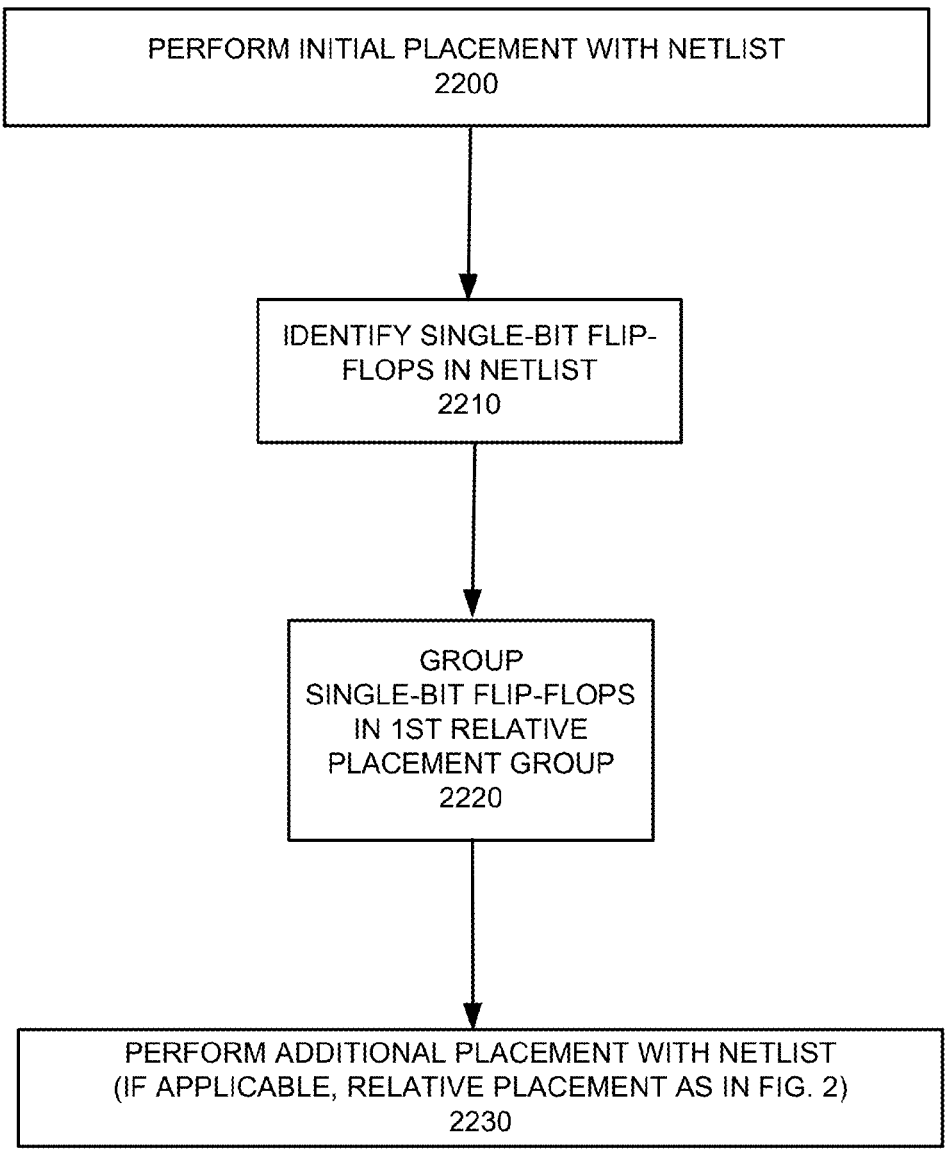
FIGS. 22-23 are flow diagrams illustrating a second exemplary process of replacement of single-bit flip-flops, by one or more relative placement groups of single-bit flip-flops, which as applicable, modifies the process flow of FIG. 2.
Figure 23:
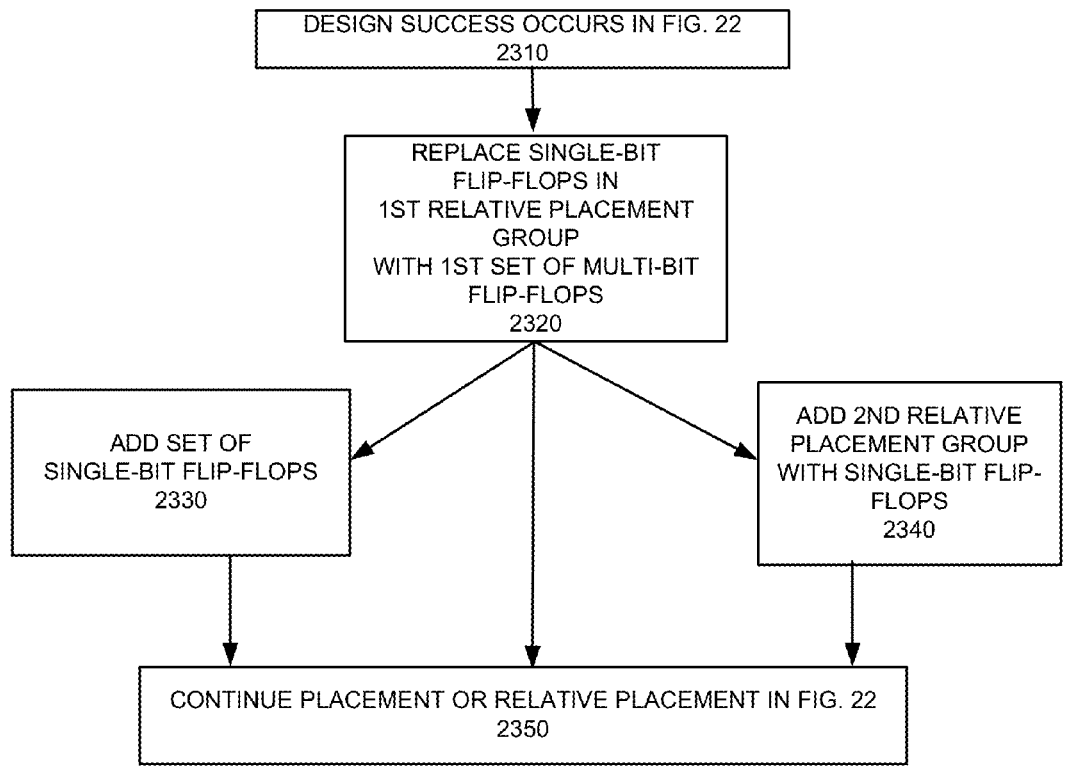

FIGS. 22-23 are flow diagrams illustrating a second exemplary process of replacement of single-bit flip-flops, by one or more relative placement groups of single-bit flip-flops, which as applicable, modifies the process flow of FIG. 2.

FIGS. 22-23 are broadly similar to FIGS. 19-21, except that, following the initial placement, or early placement, the identified single-bit flip-flops are not replaced immediately with multi-bit flip-flops. However, after a design success, subsequent replacement with multi-bit flip-flops is possible.

FIG. 22 starts with an initial placement 2200 with a netlist. The placement may also be another placement subsequent to the initial placement with the netlist. In 2210, single-bit flip-flops in the netlist are identified, such as with the CTC techniques described above.

Next in 2220, in one embodiment, a first set of single-bit flip-flops is grouped into a first relative placement group. The process flow continues with 2230, where additional placement with the netlist is performed. If applicable, the additional placement is performed according to the relative placement as shown in FIG. 2.

FIG. 23 supplements the process flow in FIG. 22 with a design success 2310, such as with timing, power, and routability constraints. In 2320, single-bit flip-flops in the first relative placement group are replaced with a first set of multi-bit flip-flops. Because multi-bit flip-flops have advantages such as reduced power, ongoing design success indicates that the design may be further improved with such replacement.

FIG. 23 has further options depending on whether the multi-bit flops have a corresponding size to replace all of the single-bit flip-flops. In the event that all of the single-bit flip-flops are replaced by the multi-bit flip-flops, the process continues with 2350, further placement or relative placement. However, there may be leftover single-bit flip-flops that were not replaced. In 2330, such leftover single-bit flip-flops can be added as a set of single-bit flip-flops. Or, in 2340, such leftover single-bit flip-flops can be added as a second relative placement group. Then, the process continues with 2350, further placement or relative placement.

Figure 24:
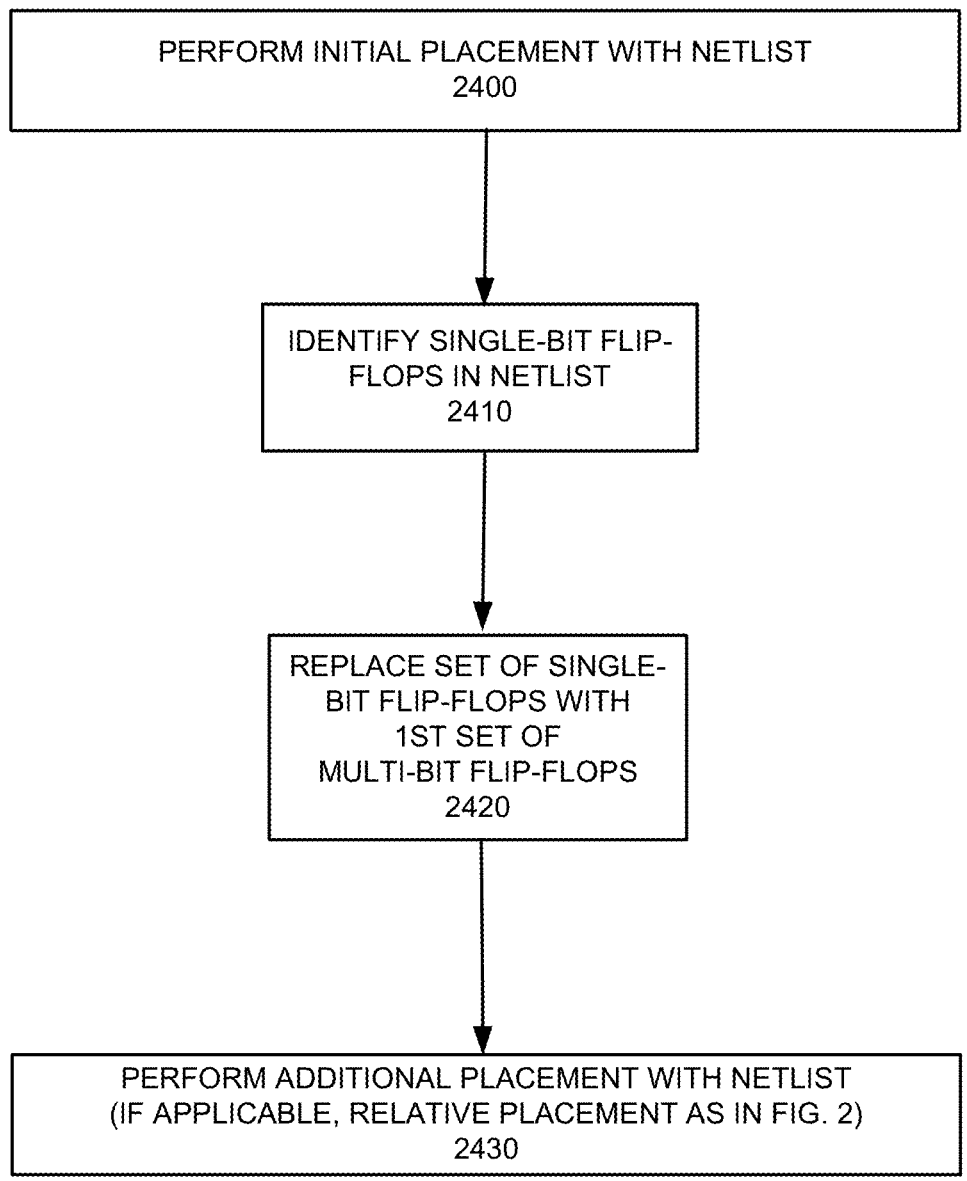
FIGS. 24-25 are flow diagrams illustrating a third exemplary process of replacement of single-bit flip-flops by one or more multi-bit flips-flops, which as applicable, modifies the process flow of FIG. 2.
Figure 25:
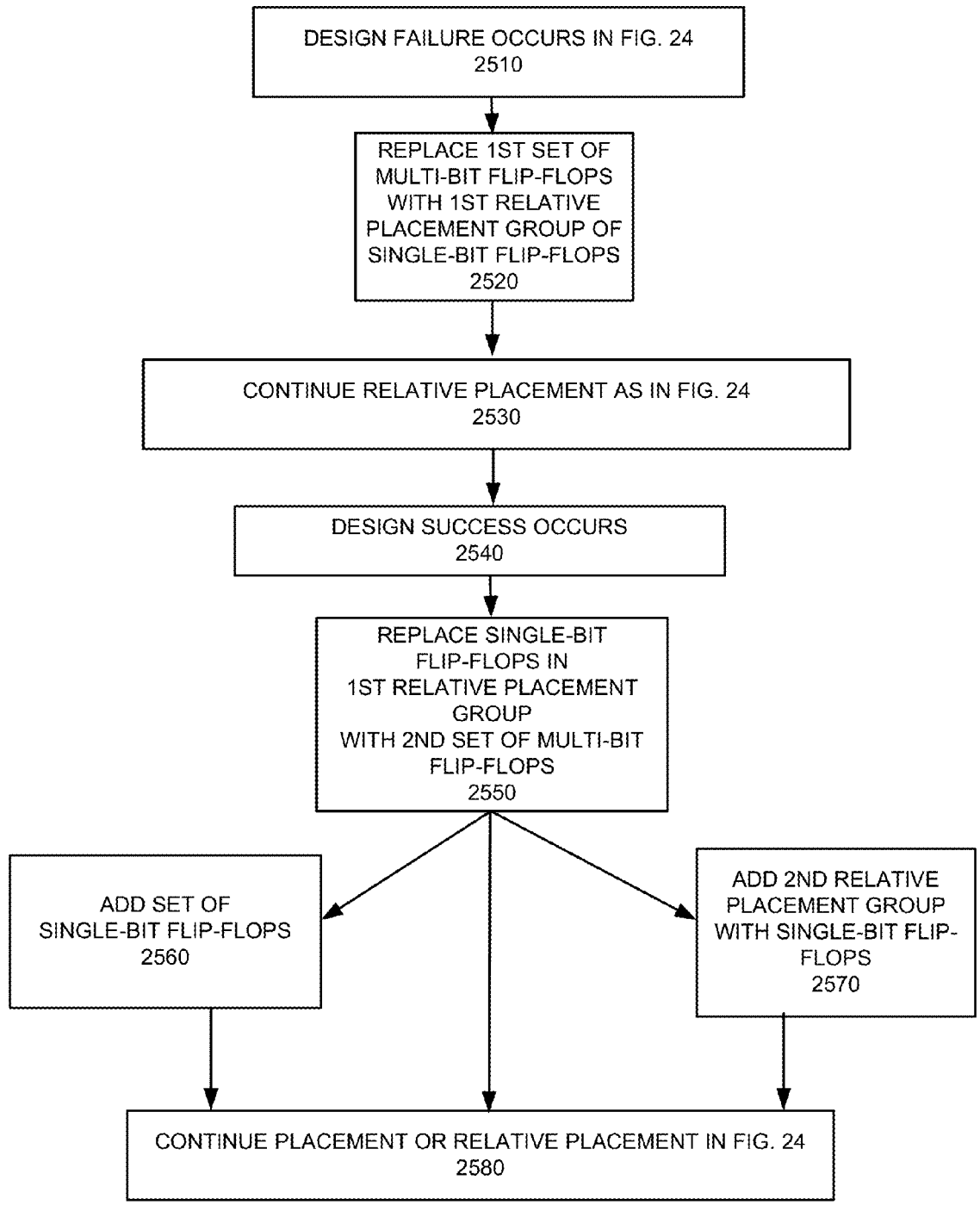

FIGS. 24-25 are flow diagrams illustrating a third exemplary process of replacement of single-bit flip-flops by one or more multi-bit flips-flops, which as applicable, modifies the process flow of FIG. 2.

FIGS. 24-25 are broadly similar to FIGS. 19-21, except that, following the initial placement, or early placement, the identified single-bit flip-flops are not immediately grouped into a relative placement group. However, after a design failure, subsequent replacement with a relative placement group is possible.

FIG. 24 starts with an initial placement 2400 with a netlist. The placement may also be another placement subsequent to the initial placement with the netlist. In 2410, single-bit flip-flops in the netlist are identified, such as with the CTC techniques described above.

Next in 2420, in one embodiment, a first set of single-bit flip-flops is replaced with a first set of multi-bit flip-flops. The process flow continues with 2430, where additional placement with the netlist is performed. If applicable, the additional placement is performed according to the relative placement as shown in FIG. 2.

FIG. 25 supplements the process flow in FIG. 14 with a design failure 2510, such as with timing, power, and routability constraints. In 2520, the first set of multi-bit flip-flops are replaced with a first relative placement group of single-bit flip-flops. Then, the process continues with 2530, further placement or relative placement.

The shown examples may be iterative with design failures and successes relating to one or more of timing, power, and routability constraints, such that a design success follows a design success, a design success follows a design failure, a design failure follows a design success, and/or a design failure follows a design failure. In the particular example of FIG. 25, a design failure 2510 is followed by a design success 2540, with subsequent steps similar to FIG. 23.

In 2550, single-bit flip-flops in the first relative placement group are replaced with a second set of multi-bit flip-flops. In the event that all of the single-bit flip-flops are replaced by the multi-bit flip-flops, the process continues with 2580, further placement or relative placement. However, there may be leftover single-bit flip-flops that were not replaced. In 2560, such leftover single-bit flip-flops can be added as a set of single-bit flip-flops. Or, in 2570, such leftover single-bit flip-flops can be added as a second relative placement group. Then, the process continues with 2580, further placement or relative placement.

Figure 26:
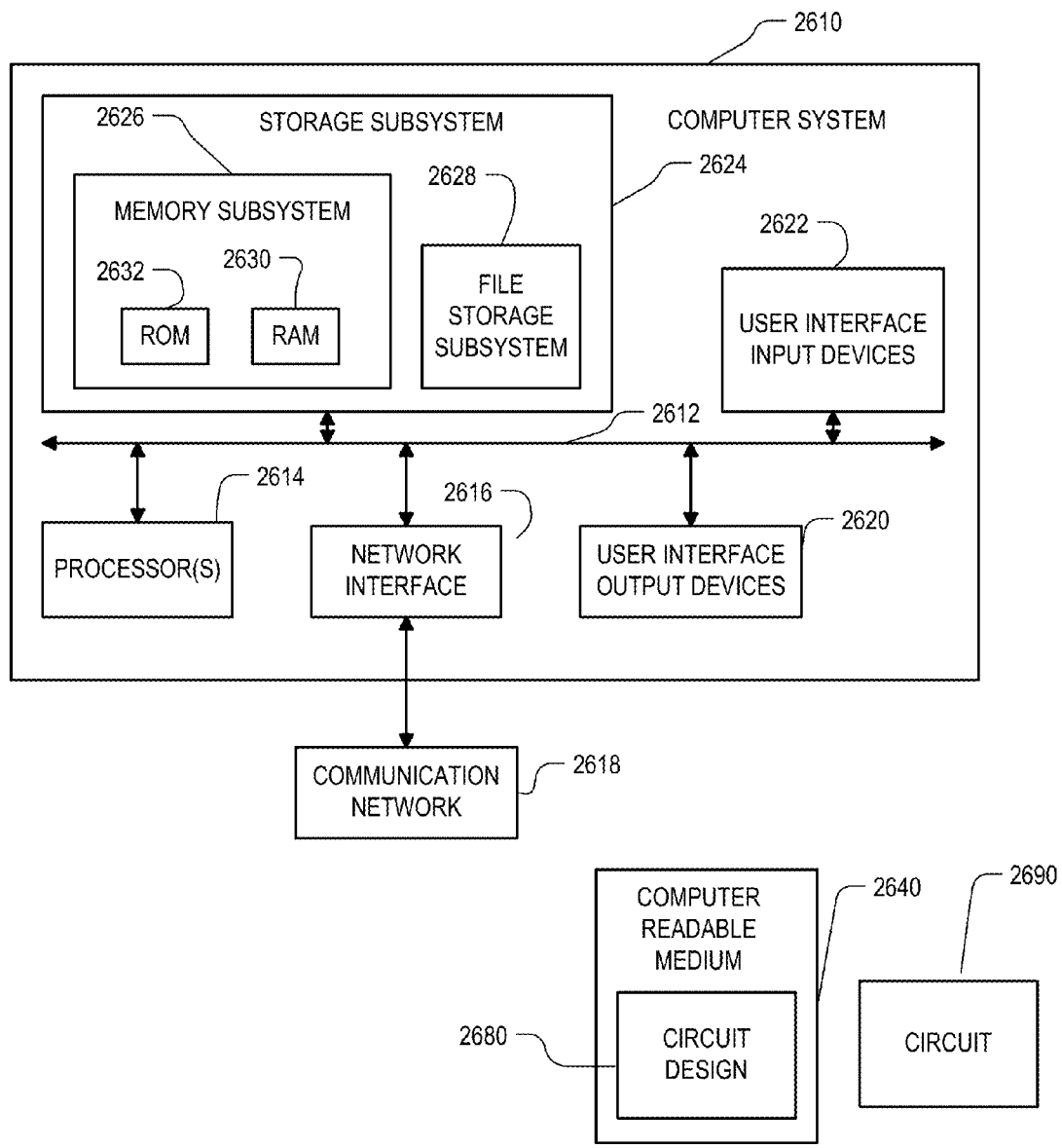
FIG. 26 is a simplified block diagram of a computer system suitable for use with embodiments of the technology, as well as a circuit design and circuit embodiments of the technology.

FIG. 26 is a simplified block diagram of a computer system 2610 suitable for use with embodiments of the technology. Computer system 2610 typically includes at least one processor 2614 which communicates with a number of peripheral devices via bus subsystem 2612. These peripheral devices may include a storage subsystem 2624, comprising a memory subsystem 2626 and a file storage subsystem 2628, user interface input devices 2622, user interface output devices 2620, and a network interface subsystem 2616. The input and output devices allow user interaction with computer system 2610. Network interface subsystem 2616 provides an interface to outside networks, including an interface to communication network 2618, and is coupled via communication network 2618 to corresponding interface devices in other computer systems. Communication network 2618 may comprise many interconnected computer systems and communication links. These communication links may be wireline links, optical links, wireless links, or any other mechanisms for communication of information. While in one embodiment, communication network 2618 is the Internet, in other embodiments, communication network 2618 may be any suitable computer network.

User interface input devices 2622 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 2610 or onto computer network 2618.

User interface output devices 2620 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 2610 to the user or to another machine or computer system.

Storage subsystem 2624 stores the basic programming and data constructs that provide the functionality of certain embodiments, such as replacement of single-bit flip-flops with multi-bit flip-flops and/or relative placement groups of single-bit flip-flops. For example, the various modules implementing the functionality of certain embodiments may be stored in storage subsystem 2624. These software modules are generally executed by processor 2614.

Memory subsystem 2626 typically includes a number of memories including a main random access memory (RAM) 2630 for storage of instructions and data during program execution and a read only memory (ROM) 2632 in which fixed instructions are stored. File storage subsystem 2628 provides persistent storage for program and data files, and may include a hard disk drive, a floppy disk drive along with associated removable media, a CD-ROM drive, an optical drive, or removable media cartridges. The databases and modules implementing the functionality of certain embodiments may be stored by file storage subsystem 2628.

Bus subsystem 2612 provides a mechanism for letting the various components and subsystems of computer system 2610 communicate with each other as intended. Although bus subsystem 2612 is shown schematically as a single bus, alternative embodiments of the bus subsystem may use multiple busses.

Computer readable medium 2640 can be a medium associated with file storage subsystem 2628, and/or with network interface 2616. The computer readable medium can be a hard disk, a floppy disk, a CD-ROM, an optical medium, removable media cartridge, or electromagnetic wave. The computer readable medium 2640 is shown storing a circuit design 2680 created with the described technology, such as replacement of single-bit flip-flops with multi-bit flip-flops and/or relative placement groups of single-bit flip-flops. Also shown is a circuit 2690 created with the described technology, such as replacement of single-bit flip-flops with multi-bit flip-flops and/or relative placement groups of single-bit flip-flops.

Computer system 2610 itself can be of varying types including a personal computer, a portable computer, a workstation, a computer terminal, a network computer, a television, a mainframe, or any other data processing system or user device. Due to the ever-changing nature of computers and networks, the description of computer system 2610 depicted in FIG. 26 is intended only as a specific example for purposes of illustrating the preferred embodiments. Many other configurations of computer system 2610 are possible having more or less components than the computer system depicted in FIG. 26.

While the present invention is disclosed by reference to the embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of circuit design in an integrated circuit EDA flow for lithographic masks for production of integrated circuits with a computer system, comprising:
generating with the computer system a placed, routed, and optimized circuit design in the integrated circuit EDA flow for lithographic masks for production of integrated circuits, including:
with the computer system, performing a first placement for a netlist of the circuit design according to a first set of circuit element positioning rules;
with the computer system, identifying a plurality of single-bit flip-flops in the circuit design including at least a first set of single-bit flip-flops and a second set of single-bit flip-flops;
with the computer system, grouping the second set of single-bit flip-flops together as a first relative placement set of single-bit flip-flops, and replacing the first set of single-bit flip-flops in the circuit design with at least a first set of multi-bit flip-flops in the circuit design;
with the computer system, creating a second set of circuit element positioning rules for the first relative placement set of single-bit flip-flops based on a result of the first placement, the second set of circuit element positioning rules specifying positioning of the first relative placement set of single-bit flip-flops;
responsive to a design success with the first relative placement set of single-bit flip-flops in the circuit design, replacing the first relative placement set of single-bit flip-flops in the circuit design, with at least a second set of multi-bit flip-flops in the circuit design; and
with the computer system, completing placement, routing, and optimization of the netlist of the circuit design according to the second set of circuit element positioning rules.

2. The method of claim 1, further comprising:
responsive to a design failure with the first set of multi-bit flip-flops in the circuit design, replacing the first set of multi-bit flip-flops in the circuit design, with at least a second relative placement set of single-bit flip-flops in the circuit design.

3. The method of claim 1, further comprising:
responsive to a design failure with the first set of multi-bit flip-flops in the circuit design, replacing the first set of multi-bit flip-flops in the circuit design, with at least a second set of multi-bit flip-flops in the circuit design, wherein multi-bit flip-flops in the second set of multi-bit flip-flops have fewer inputs per flip-flop than in the first set of multi-bit flip-flops in the circuit design.

4. The method of claim 1, further comprising:
responsive to a design failure with the first set of multi-bit flip-flops in the circuit design, replacing the first set of multi-bit flip-flops in the circuit design, with at least (i) a second set of multi-bit flip-flops in the circuit design and (ii) a third set of single-bit flip flops, wherein multibit flip-flops in the second set of multi-bit flip-flops have fewer inputs per flip-flop than in the first set of multi-bit flip-flops in the circuit design.

5. The method of claim 1, further comprising:
responsive to a design failure with the first set of multi-bit flip-flops in the circuit design, replacing the first set of multi-bit flip-flops in the circuit design, with at least (i) a second set of multi-bit flip-flops in the circuit design and (ii) a second relative placement set of single-bit flip flops, wherein multi-bit flip-flops in the second set of multi-bit flip-flops having fewer inputs per flip-flop than in the first set of multi-bit flip-flops in the circuit design.

6. The method of claim 1, further comprising:
responsive to the design success with the first relative placement set of single-bit flip-flops in the circuit design, in addition to replacing the first relative placement set of single-bit flip-flops in the circuit design with at least the second set of multi-bit flip-flops in the circuit design, replacing the first relative placement set of single-bit flip-flops in the circuit design, with at least a third set of single-bit flip-flops in the circuit design.

7. The method of claim 1, further comprising:
responsive to the design success with the first relative placement set of single-bit flip-flops in the circuit design, in addition to replacing the first relative placement set of single-bit flip-flops in the circuit design with at least the second set of multi-bit flip-flops in the circuit design, replacing the first relative placement set of single-bit flip-flops in the circuit design, with at least a second relative placement set of single-bit flip-flops in the circuit design.

8. A method of circuit design in an integrated circuit EDA flow for lithographic masks for production of integrated circuits with a computer system, comprising:
generating with the computer system a placed, routed, and optimized circuit design in the integrated circuit EDA flow for lithographic masks for production of integrated circuits, including:
with the computer system, performing a first placement for a netlist of the circuit design according to a first set of circuit element positioning rules;
with the computer system, identifying a plurality of single-bit flip-flops in the circuit design including at least a first relative placement set of single-bit flip-flops;
with the computer system, creating a second set of circuit element positioning rules for the first relative placement set of single-bit flip-flops based on a result of the first placement, the rules specifying positioning of the first relative placement set of single-bit flip-flops;
with the computer system, replacing the first relative placement set of single-bit flip-flops in the circuit design with at least a first set of multi-bit flip-flops in the circuit design; and
responsive to a design failure with the first set of multi-bit flip-flops in the circuit design, replacing the first set of multi-bit flip-flops in the circuit design, with at least a second relative placement set of single-bit flip-flops in the circuit design.

9. The method of claim 8, wherein
said replacing includes, replacing the first relative placement set of single-bit flip-flops in the circuit design with at least (i) the first set of multi-bit flip-flops in the circuit design and (ii) a set of single-bit flip-flops.

10. The method of claim 8, wherein
said replacing includes, replacing the first relative placement set of single-bit flip-flops in the circuit design with at least (i) the first set of multi-bit flip-flops in the circuit design and (ii) a second relative placement set of single-bit flip-flops.

11. The method of claim 8, wherein multi-bit flip-flops in the second set of multi-bit flip-flops have fewer inputs per flip-flop than in the first set of multi-bit flip-flops in the circuit design.

12. A method of circuit design in an integrated circuit EDA flow for lithographic masks for production of integrated circuits with a computer system, comprising:
generating with the computer system a placed, routed, and optimized circuit design in the integrated circuit EDA flow for lithographic masks for production of integrated circuits, including:
with the computer system, performing a first placement for a netlist of the circuit design according to a first set of circuit element positioning rules;
with the computer system, identifying a plurality of flip-flops in the circuit design including at least a first set of multi-bit flip-flops;
with the computer system, replacing the first set of multi-bit flip-flops in the circuit design with a first relative placement set of single-bit flip-flops in the circuit design; and
with the computer system, creating a second set of circuit element positioning rules for the first relative placement set of single-bit flip-flops based on a result of the first placement, the rules specifying positioning of the first relative placement set of single-bit flip-flops.

13. The method of claim 12, wherein
said replacing the first set of multi-bit flip-flops in the circuit design, with at least the first relative placement set of single-bit flip-flops in the circuit design, is responsive to a design failure with the first set of multi-bit flip-flops in the circuit design.

14. The method of claim 12, further comprising:
responsive to a design success with the first relative placement set of single-bit flip-flops in the circuit design, replacing the first relative placement set of single-bit flip-flops in the circuit design, with at least a second set of multi-bit flip-flops in the circuit design.

15. The method of claim 12, further comprising:
responsive to a design success with the first relative placement set of single-bit flip-flops in the circuit design, replacing the first relative placement set of single-bit flip-flops in the circuit design, with at least (i) a second set of multi-bit flip-flops in the circuit design and (ii) a set of single-bit flip-flops in the circuit design.

16. The method of claim 12, further comprising:
responsive to a design success with the first relative placement set of single-bit flip-flops in the circuit design, replacing the first relative placement set of single-bit flip-flops in the circuit design, with at least (i) a second set of multi-bit flip-flops in the circuit design and (ii) a second relative placement set of single-bit flip-flops in the circuit design.

* * * * *